(12) United States Patent
Lu

(10) Patent No.: US 12,417,798 B2
(45) Date of Patent: Sep. 16, 2025

(54) SEMICONDUCTOR MEMORY STRUCTURE

(71) Applicant: Invention And Collaboration Laboratory Pte. Ltd., Singapore (SG)

(72) Inventor: Chao-Chun Lu, Taipei (TW)

(73) Assignees: Invention And Collaboration Laboratory Pte. Ltd., Singapore (SG); Etron Technology, Inc., Hsinchu (TW)

( * ) Notice: Subject to any disclaimer, the term of this patent is extended or adjusted under 35 U.S.C. 154(b) by 223 days.

(21) Appl. No.: 18/139,374

(22) Filed: Apr. 26, 2023

(65) Prior Publication Data

US 2023/0352079 A1    Nov. 2, 2023

Related U.S. Application Data

(60) Provisional application No. 63/335,231, filed on Apr. 27, 2022.

(51) Int. Cl.
| | |
|---|---|
| *G11C 11/4091* | (2006.01) |
| *G11C 11/4097* | (2006.01) |
| *H01L 25/065* | (2023.01) |
| *H10B 80/00* | (2023.01) |

(52) U.S. Cl.
CPC ...... *G11C 11/4091* (2013.01); *G11C 11/4097* (2013.01); *H01L 25/0655* (2013.01); *H10B 80/00* (2023.02)

(58) Field of Classification Search
CPC ............. G11C 11/4091; G11C 11/4097; H01L 25/0655; H10B 80/00; H10B 12/50; H10B 12/34; H10B 12/488; H10B 12/482; H10B 12/315; H10B 12/485
USPC .............................................. 365/149, 189.11
See application file for complete search history.

(56) References Cited

U.S. PATENT DOCUMENTS

| | | | |
|---|---|---|---|
| 5,719,814 A | 2/1998 | Ishikawa | |
| 2008/0151674 A1* | 6/2008 | Ohata | G11C 7/08 365/227 |
| 2010/0246295 A1* | 9/2010 | Jang | G11C 7/222 365/207 |
| 2011/0216571 A1* | 9/2011 | Yamazaki | H10B 10/00 365/72 |
| 2011/0313747 A1* | 12/2011 | Joshi | G06F 30/23 703/14 |
| 2012/0081948 A1* | 4/2012 | Takemura | G11C 11/4097 365/149 |
| 2012/0224442 A1* | 9/2012 | Romanovskyy | G11C 11/4091 365/194 |

(Continued)

FOREIGN PATENT DOCUMENTS

| | | | | |
|---|---|---|---|---|
| CN | 102800352 A | * | 11/2012 | ........... G11C 11/408 |
| EP | 0449207 A2 | * | 3/1991 | ........... G11C 11/409 |

(Continued)

*Primary Examiner* — Michael T Tran
(74) *Attorney, Agent, or Firm* — Winston Hsu

(57) ABSTRACT

A semiconductor memory structure includes a plurality of DRAM cells, a bit line, and a sense amplifier. Each DRAM cell includes an access transistor and a storage capacitor. The bit line has a first terminal extended along the plurality of DRAM cells to a second terminal, and the bit line is coupled to each access transistor of the plurality of DRAM cells. The sense amplifier is coupled to the first terminal of the bit line. A capacitance of the bit line per DRAM cell is lower than $20 \times 10^{-3}$ fF.

15 Claims, 30 Drawing Sheets

(56) References Cited

U.S. PATENT DOCUMENTS

| | | | |
|---|---|---|---|
| 2012/0314483 A1* | 12/2012 | Tsukada | G11C 11/39 |
| | | | 365/207 |
| 2020/0212041 A1 | 7/2020 | Machkaoutsan | |
| 2020/0395362 A1 | 12/2020 | Park | |
| 2021/0074347 A1* | 3/2021 | Van Ostrand | G11C 11/4096 |
| 2022/0102206 A1* | 3/2022 | Jin | H01L 21/76834 |
| 2022/0115384 A1* | 4/2022 | An | H10B 12/50 |
| 2022/0139920 A1* | 5/2022 | Lee | H10B 12/033 |
| | | | 438/241 |
| 2022/0351790 A1* | 11/2022 | Hsu | G11C 16/3459 |

FOREIGN PATENT DOCUMENTS

| | | | | |
|---|---|---|---|---|
| EP | 4075436 A1 * | 10/2022 | | G11C 11/406 |
| KR | 10-2014-0086305 A | 7/2014 | | |
| KR | 10-2020-0143113 A | 12/2020 | | |
| KR | 10-2021-0096698 A | 8/2021 | | |

* cited by examiner (a)

(b)

(a)

(b)

(a)

(b)

SEMICONDUCTOR MEMORY STRUCTURE

CROSS REFERENCE TO RELATED APPLICATIONS

This application claims the benefit of U.S. Provisional Application No. 63/335,231, filed on Apr. 27, 2022. The content of the application is incorporated herein by reference.

BACKGROUND OF THE INVENTION

1. Field of the Invention

The present invention relates to a semiconductor memory structure, and particularly to a semiconductor memory structure which can dramatically reduce total capacitance related to one bit line.

2. Description of the Prior Art

Please refer to FIG. 1A which illustrates the conventional DRAM (dynamic random access memory) structure, the data XIO (for example, signal ONE (corresponding to a voltage VCCA (e.g. 1.1V)) or signal High) will be transferred along the data input circuit DI, the global I/O path GIO, the data line sense amplifier 70, the data lines DL&DLB, and then the bit lines BL&BLB, wherein DLB represents a complementary data line and BLB represents a complementary bit line. Furthermore, the data XIO will be stored in a corresponding storage node of the memory array 75 through the bit line BL. In the memory array 75, as shown in FIG. 1B, a sense amplifier 80 is connected to the bit line BL which is coupled to the data line DL through the bit line switch BS100. In addition, the sense amplifier 80 is also connected to the bit line BLB which is coupled to the data line DLB through the bit line switch BS100. A plurality DRAM cells (such as 256, 512, or 1024 DRAM cells) are connected to one bit line BL. The bit line BL has a first terminal end E1 connected to the first DRAM cell of the plurality DRAM cells and a second terminal end E2 connected to the last DRAM cell of the plurality DRAM cells. In addition, the sense amplifier 80 is coupled to a voltage VCCSA though a switch controlled by signal EN2 and coupled to a voltage VSS (e.g. 0V) though another switch controlled by signal EN1. In FIG. 1C, using one DRAM cell which includes an access transistor 11 and a storage capacitor 12 as an example, the gate of the access transistor 11 is coupled to a word line WL and the sense amplifier 22 is coupled to the access transistor 11 through the bit line BL, and one plate of the storage capacitor 12 is coupled to a plate voltage Vpl. The DRAM cell uses the access transistor 11 as a switch to control the charges to be stored from the bit line BL into the capacitor in WRITE mode or to be transferred out to bit line in READ mode.

In summary, (1) a DRAM cell array design shown in FIGS. 1A, 1B, 1C: includes many DRAM cells, such as the most popular 1T1C cell including one access transistor (having threshold voltage Vth, usually around 0.7V nominal) and one storage capacitor (having capacitance Cstorage (usually 17 fF typical)); (2) these many 1T1C cells have their drains of the access transistors to be connected respectively on an interconnection which is named as bit line BL; (3) the gates of these 1T transistors are also connected respectively by an interconnection which is named as word line WL. The bit line BL is connected to a sense amplifier 22, for example, which is a CMOS (complementary metal-oxide-semiconductor) cross-couple circuits. Correspondingly, there is another bit line, named as bit line bar BLB which carries a complementary signal to that of bit line and is also connected to the same sense amplifier 22. Along such bit line BL and bit line bar BLB interconnections there are other devices to be connected for performing complete bit line functions in operations, such as bit line equalization devices for equalizing the voltage potentials as needed and bit switch devices for controlling signals in between bit lines to the data lines.

FIG. 1D shows the related signal waveforms during access (READ or WRITE) operations of most current DRAMs. The basic cell access operation for a READ command is described as follows: (1) at a start phase the bit line BL and bit line bar BLB is normally equalized at a Half-VCC level through those bit line equalization devices; (2) when an active READ operation starts, the voltage of the word line WL is raised to a high voltage level such as VPP to fully turn on the access transistor; (3) then the DRAM cell storage charges in the storage capacitor will be transferred through the access transistor to the bit line BL to change the voltage, that is, there appears a small sensing voltage ΔV, about 100 mV, which is either additive above the Half-VCC level (called as initial sensing signal ONE) or subtractive below the Half-VCC level (called as initial sensing signal ZERO); (4) the magnitude of the small sensing voltage ΔV can be calculated as equation (1):

$$\Delta V = 1/2 \times VCC \times [C\text{storage}/(C\text{storage} + C\text{bitline} + C\text{senseamp} + C\text{bitswitch} + C\text{eq}] \quad (1)$$

(5) After most charges have been transferred from the storage capacitor to the bit line BL, then the cross-couple sense-amplifier can be triggered on by the well-designed latch-signals to start amplify the small sensing voltage ΔV to larger signals.

To give a state-of-the-art design on the DRAM cell array, Cstorage ~17 fF, Cbitline ~27.5 fF (each bit line capacitance per cell ~0.04 fF, thus the bit line capacitance of a bit line BL which is connected with 688 cells), (Csenseamp+Cbitswich+Ceq) ~11 fF, VCC ~1.1 V, and as a result, ΔV ~168 mV, which is quite sufficient for a successful sensing and amplification. By taking a different perspective on the design of Cstorage or VCC, if the minimum ΔV is required to be 100 mV, then either the minimum Cstorage can be or the VCC can be 0.67 V.

The typical design flow is to select a cell design, for example, either a stacked-capacitor over the access transistor (stacked capacitor design) or a trench-capacitor connected to the transistor. Then based on the defined process integration, the cell topography can be well defined; then the bit line capacitance per cell can be defined by the capacitance from the cell topography and then the entire Cbitline can be thus defined consequently. In the conventional DRAM, the capacitance of the bit line per DRAM cell (Cbl) made by tens nm technology node (such as 15~28 nm technology node) is around $40 \times 10^{-3}$ fF by assuming connecting 688 or 512 cells on a bit line, and Table 1 shows a typical example of the capacitances related to the bit line per cell. The technology node could be the minimum feature size of such technology node process or the dimension claimed by the foundry manufacturer in such technology node process.

TABLE 1

| Components | ×10⁻³/F |
|---|---|
| bit line to bit line | ~2 |
| bit line to S-SN (Self storage node) | ~13 |
| bit line to O-SN (Other storage nodes) | ~12 |
| bit line to word line | ~12 |
| bit line to substrate | ~1 |
| Total | 40 |

Because the greater the capacitance of the bit line per cell, related to a bit line is, the fewer the number of DRAM cells connected to the bit line can be, how to reduce the total capacitance related to the bit line has become an important issue for a designer of the DRAM cells.

SUMMARY OF THE INVENTION

An embodiment of the present invention provides a semiconductor memory structure. The semiconductor memory structure includes a plurality of DRAM (dynamic random access memory) cells, a bit line, and a sense amplifier. Each DRAM cell includes an access transistor and a storage capacitor. The bit line has a first terminal extended along the plurality of DRAM cells to a second terminal, and the bit line is coupled to each access transistor of the plurality of DRAM cells. The sense amplifier is coupled to the first terminal of the bit line. A capacitance of the bit line per DRAM cell is lower than $20 \times 10^{-3}$ fF.

According to one aspect of the invention, the capacitance of the bit line per DRAM cell is around $10 \times 10^{-3}$ fF.

According to one aspect of the invention, the capacitance of the bit line per DRAM cell is less than $10 \times 10^{-3} \sim 20 \times 10^{-3}$ fF.

According to one aspect of the invention, the semiconductor memory structure further includes a semiconductor substrate with a top surface, wherein the bit line is disposed under the top surface of the semiconductor substrate and isolated from the semiconductor substrate.

Another embodiment of the present invention provides a semiconductor memory structure. The semiconductor memory structure includes a plurality of DRAM cells, a bit line, and a sense amplifier. Each DRAM cell includes an access transistor and a storage capacitor. The bit line has a first terminal extended along the plurality of DRAM cells to a second terminal, and the bit line is coupled to each access transistor of the plurality of DRAM cells. The sense amplifier is coupled to the first terminal of the bit line. A capacitance of the bit line (Cbitline) between the first terminal and the second terminal is lower than 14 fF.

According to one aspect of the invention, the capacitance of the bit line between the first terminal and the second terminal is between 4~10 fF.

According to one aspect of the invention, the semiconductor memory structure further includes a semiconductor substrate with a top surface. The bit line is disposed under the top surface of the semiconductor substrate. A first side surface of the bit line is isolated from the semiconductor substrate by a first isolating material, and a second side surface of the bit line opposite to the first side surface is isolated from the semiconductor substrate by a second isolating material, and the first isolating material is different from the second isolating material.

According to one aspect of the invention, the first isolating material is SiO2, and the second isolating material is SiOCN.

According to one aspect of the invention, the semiconductor memory structure further includes a word line connected to a gate region of the access transistor of a first DRAM cell in the plurality of DRAM cells. The word line crosses above the bit line, and a bottom surface of the gate region is under the top surface of the semiconductor substrate.

Another embodiment of the present invention provides a semiconductor memory structure. The semiconductor memory structure includes a plurality of DRAM cells, a bit line, and a sense amplifier. Each DRAM cell includes an access transistor and a storage capacitor. The bit line has a first terminal extended along the plurality of DRAM cells to a second terminal, and the bit line is coupled to each access transistor of the plurality of DRAM cells. The sense amplifier is coupled to the first terminal of the bit line. The plurality of DRAM cells include more than 1032 DRAM cells.

According to one aspect of the invention, the plurality of DRAM cells include around 1240~9370 DRAM cells.

According to one aspect of the invention, the plurality of DRAM cells include around 1300~3900 DRAM cells.

According to one aspect of the invention, the semiconductor memory structure further includes a semiconductor substrate with a top surface. The bit line is disposed under the top surface of the semiconductor substrate. The bit line is vertically and horizontally spaced apart from each access transistor of the plurality of DRAM cells.

Another embodiment of the present invention provides a semiconductor memory structure. The semiconductor memory structure includes a plurality of DRAM cells, a bit line, a sense amplifier, and a voltage source. Each DRAM cell includes an access transistor and a storage capacitor. The bit line is coupled to each access transistor of the plurality of DRAM cells. The sense amplifier is coupled to a first terminal of the bit line. The voltage source is electrically connected to the sense amplifier and the bit line. The voltage source provides not greater than 0.85V to the sense amplifier.

According to one aspect of the invention, the voltage source provides around 0.4V~0.8V to the sense amplifier.

According to one aspect of the invention, the voltage source provides around 0.38V~0.6V to the sense amplifier.

Another embodiment of the present invention provides a semiconductor memory structure which is structurally different from a conventional DRAM structure made by a predetermined technology node. The semiconductor memory structure includes a plurality of DRAM cells, a bit line, and a sense amplifier. Each DRAM cell includes an access transistor and a storage capacitor. The bit line is coupled to each access transistor of the plurality of DRAM cells. The sense amplifier is coupled to a first terminal of the bit line. A capacitance of the bit line per DRAM cell of the semiconductor memory structure is lower than ½ of that of the conventional DRAM structure made by the predetermined technology node, wherein the predetermined technology node is tens nm technology node or below 10 nm technology node.

According to one aspect of the invention, the capacitance of the bit line per DRAM cell of the semiconductor memory structure is lower than ¼ of that of the conventional DRAM structure made by the predetermined technology node.

These and other objectives of the present invention will no doubt become obvious to those of ordinary skill in the art after reading the following detailed description of the preferred embodiment that is illustrated in the various figures and drawings.

DETAILED DESCRIPTION

By examining the above way of defining the value from a pre-selected cell design structure, then a Cbitline per cell (or Cbl) can be calculated by the cell topography. The inventive design here is focused on a new idea: that is, enable the Cbitline per cell to be at least one fourth of the conventional Cbitline per cell or better, and then the present invention will search for or optimally design a cell configuration in order to achieve a much lower Cbitline. As mentioned, the Cbitline per cell ("Cbl") made by tens nm technology node is around $40 \times 10^{-3}$ fF for the conventional DRAM structure, and in one embodiment of the present invention, the Cbitline per cell of the new DRAM cell structure could be lower than $30 \times 10^{-3}$ fF, such as $10 \times 10^{-3}$ fF~$20 \times 10^{-3}$ fF. Thus, using ~$10 \times 10^{-3}$ fF (e.g. ¼ of the Cbl in the conventional DRAM structure) as an example, the Cbitline will be ~5.12 fF (for 512 DRAM cells) and ~6.88 fF (for 688 DRAM cells), respectively. In contrast to the bit line design shown in Table 1, which will derive a Cbitline to be 20.48 fF (for 512 DRAM cells on a bit line) and 27.52 fF (for 688 DRAM cells on a bit line), respectively.

Figure 1A:
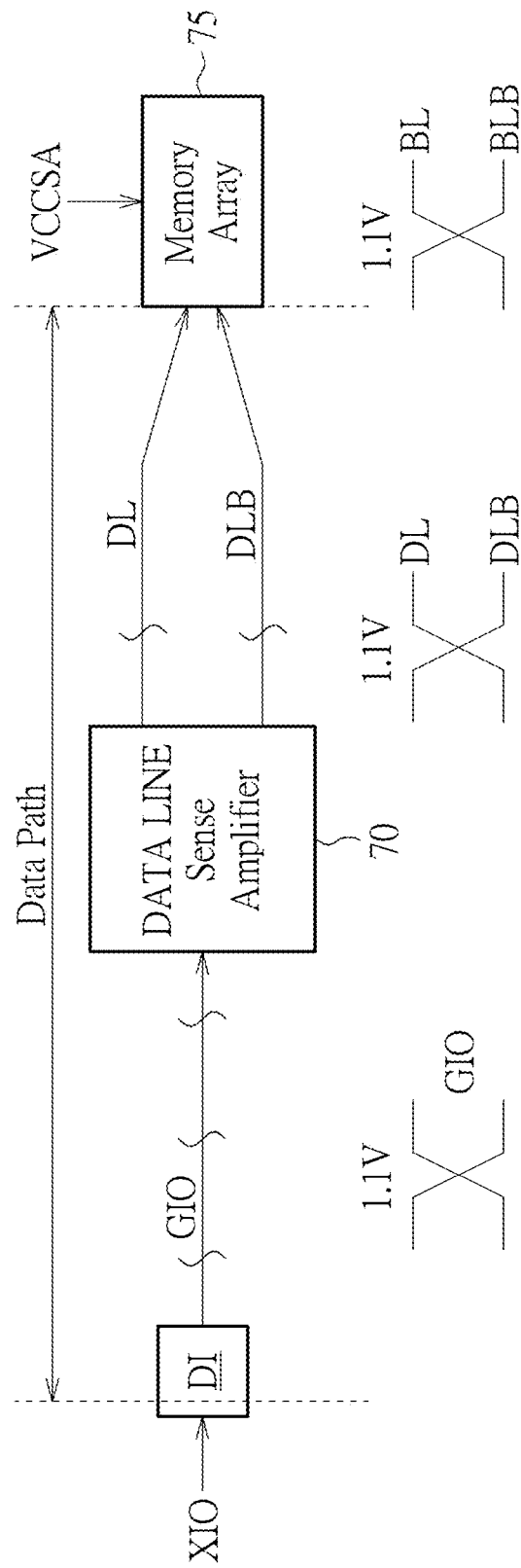
FIG. 1A illustrates a voltage swing on the data path during a write operation for a conventional lower power DRAM.
Figure 1B:
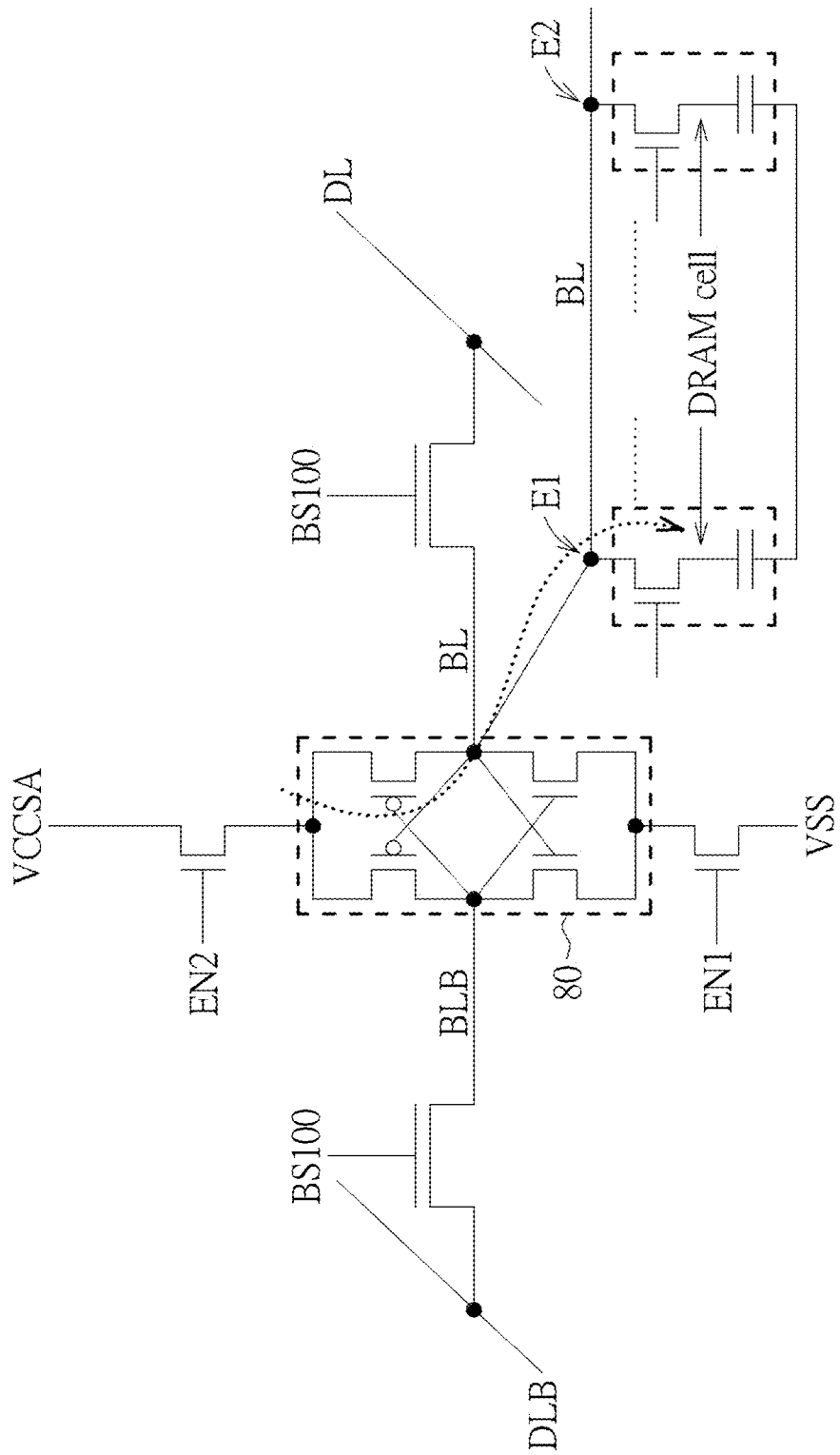
FIG. 1B illustrates a schematic circuit for the sense amplifier selectively coupled to two separate voltage sources during WRITE operation of the DRAM cell.
Figure 1C:
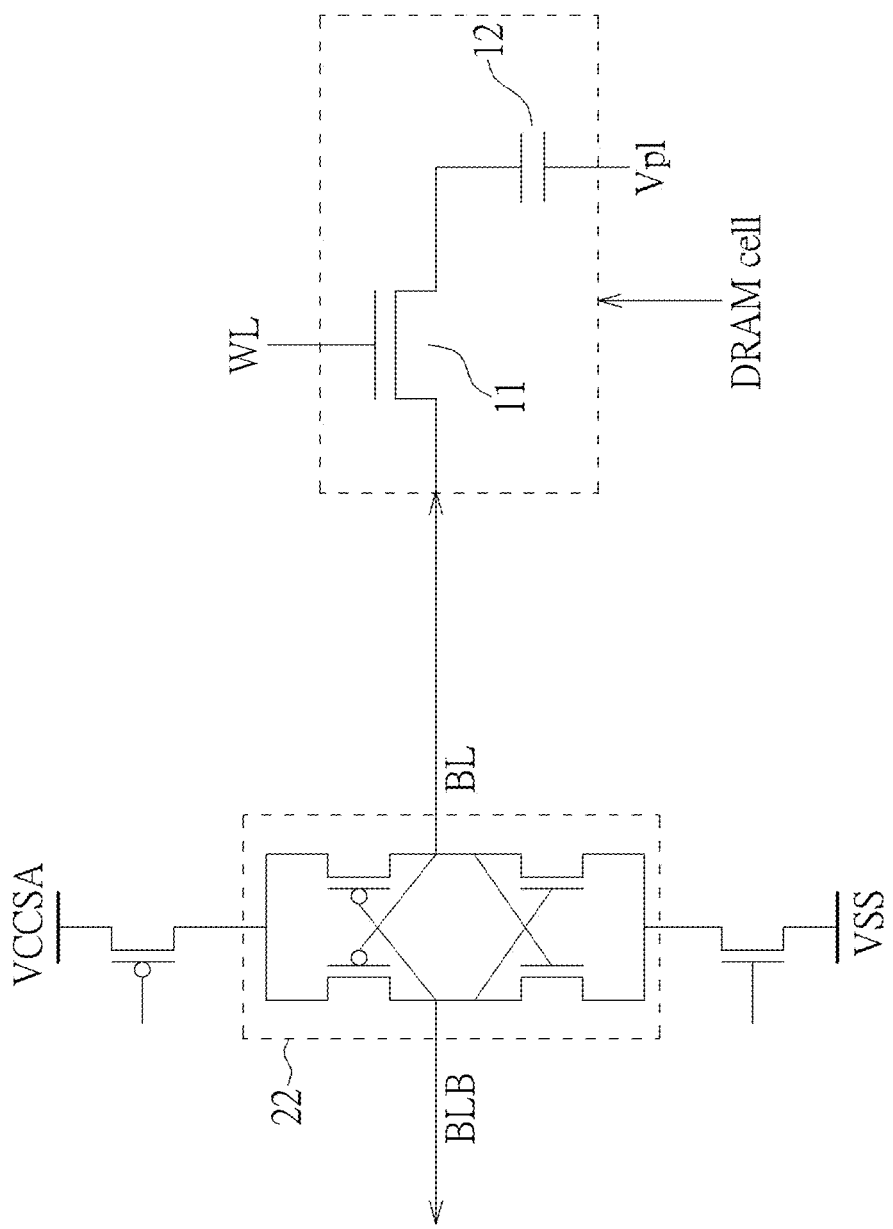
FIG. 1C illustrates commonly used design of the DRAM cell.
Figure 1D:
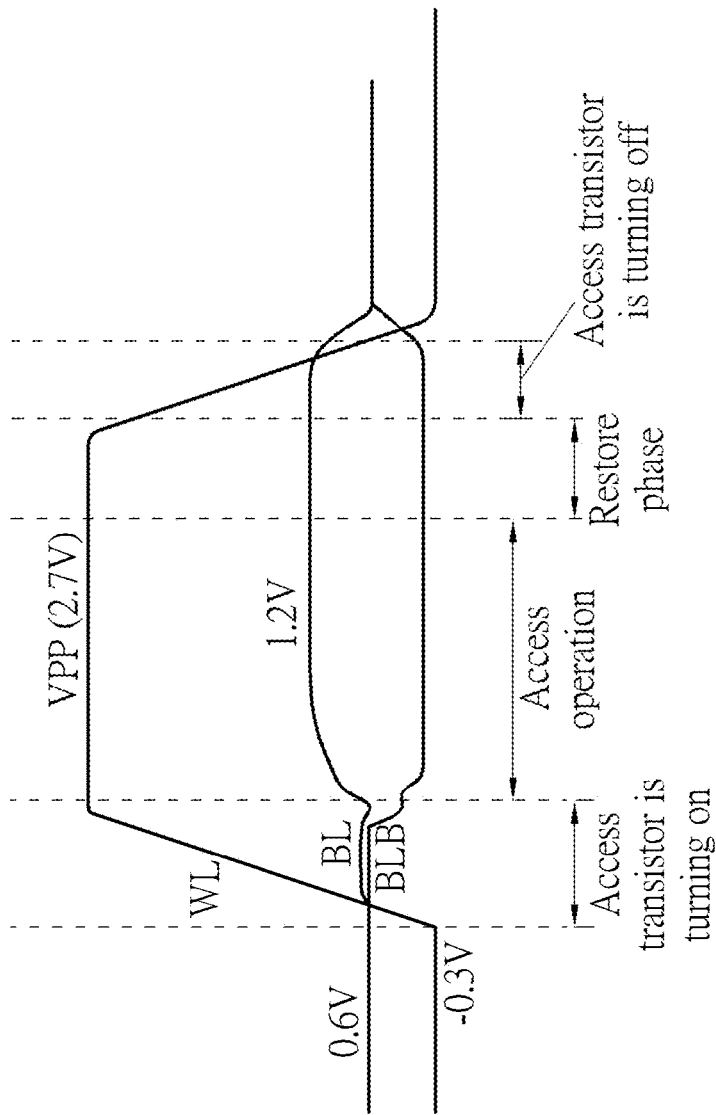
FIG. 1D illustrates the related signal waveforms during access (READ or WRITE) operation of most current DRAMs.
Figure 2A:
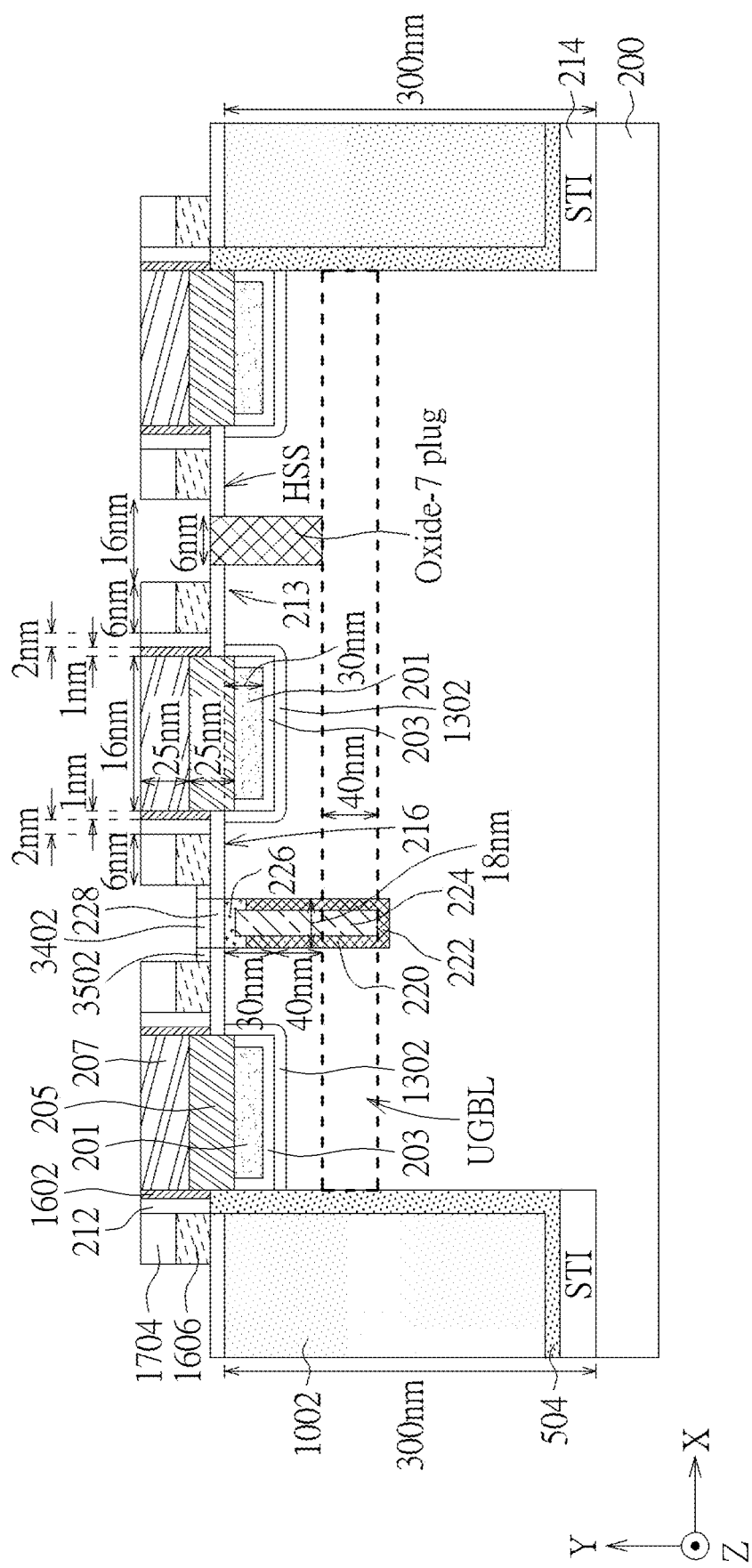
FIG. 2A illustrates the relationship between the DRAM cell and the underground bit line (UGBL).

The following present the structure of the new DRAM cell structure having bit line with very low capacitance. As shown in FIG. 2A, the access transistor of the new DRAM cell includes a recess gate 201, a drain 216 and a source 213. The recess gate (e.g., made of Tungsten (W), other metal, or poly-silicon) 201 could be under a top surface or horizontal silicon surface (HSS) of a semiconductor (such as silicon) substrate 200 and has a thickness smaller than and almost equal to 30 nm, and a word line (made of Tungsten or other metal) connected to the recess gate 201 propagates along the Z direction. There is ~2 nm high-k (Hi-K) insulator layer (or 5 nm oxide layer) 203 as gate dielectric layer surrounding the recess gate 201. Above the recess gate 201, there are ~25 nm nitride layer 205 and ~25 nm oxide layer 207 as a composite cap layer which has a width of ~16 nm. Around sidewalls of the cap layer, there are ~1 nm nitride layer 209 and ~2 nm oxide layer 212 as spacers. The source 213 with a width of ~9 nm and the drain 216 with a width of ~9 nm are located on two sides (in X-direction) of the recess gate 201.

Next to the drain 216, there is a first hole 220 with width around 18 nm and height around 110 nm~120 nm. An oxide layer 222 covers a bottom and sidewalls of the first hole 220, and a connecting plug (such as Tungsten, or other metal, or ploy-silicon) 224 is deposited within the first hole 220 and surrounded by the oxide layer 222. The thickness of the oxide layer 222 covering the sidewalls of the first hole 220 could be 2~6 nm, such as 4 nm. Between the top surface HSS of the semiconductor substrate 200 and the connecting plug 224, there is heavily doped material (such as n+ silicon) 226 covering the connecting plug 224, and the heavily doped material 226 is electrically connected to the connecting plug 224 and the drain 216. On a top of the heavily doped material 226, there is an oxide layer 228 for isolating the drain 216 from the storage capacitor (which will be introduced in FIG. 19).

Under ~70 nm from the top surface HSS of the semiconductor substrate 200, an underground bit line ("UGBL") is formed and connected to the connecting plug 224. The height of the bit line UGBL is ~40 nm and propagates along the X-direction, as marked by dash rectangle shown in FIG. 2A. The bit line UGBL is fully isolated from the semiconductor substrate 200, and a first side surface of the bit line UGBL is isolated from the semiconductor substrate 200 by a first isolating material (such as SiO2), and a second side surface of the bit line UGBL opposite to the first side surface is isolated from the semiconductor substrate 200 by a second isolating material (such as SiOCN or Si3N4). In addition, AQ1, AQ2, AQ3 represent access transistors.

Figure 2B:
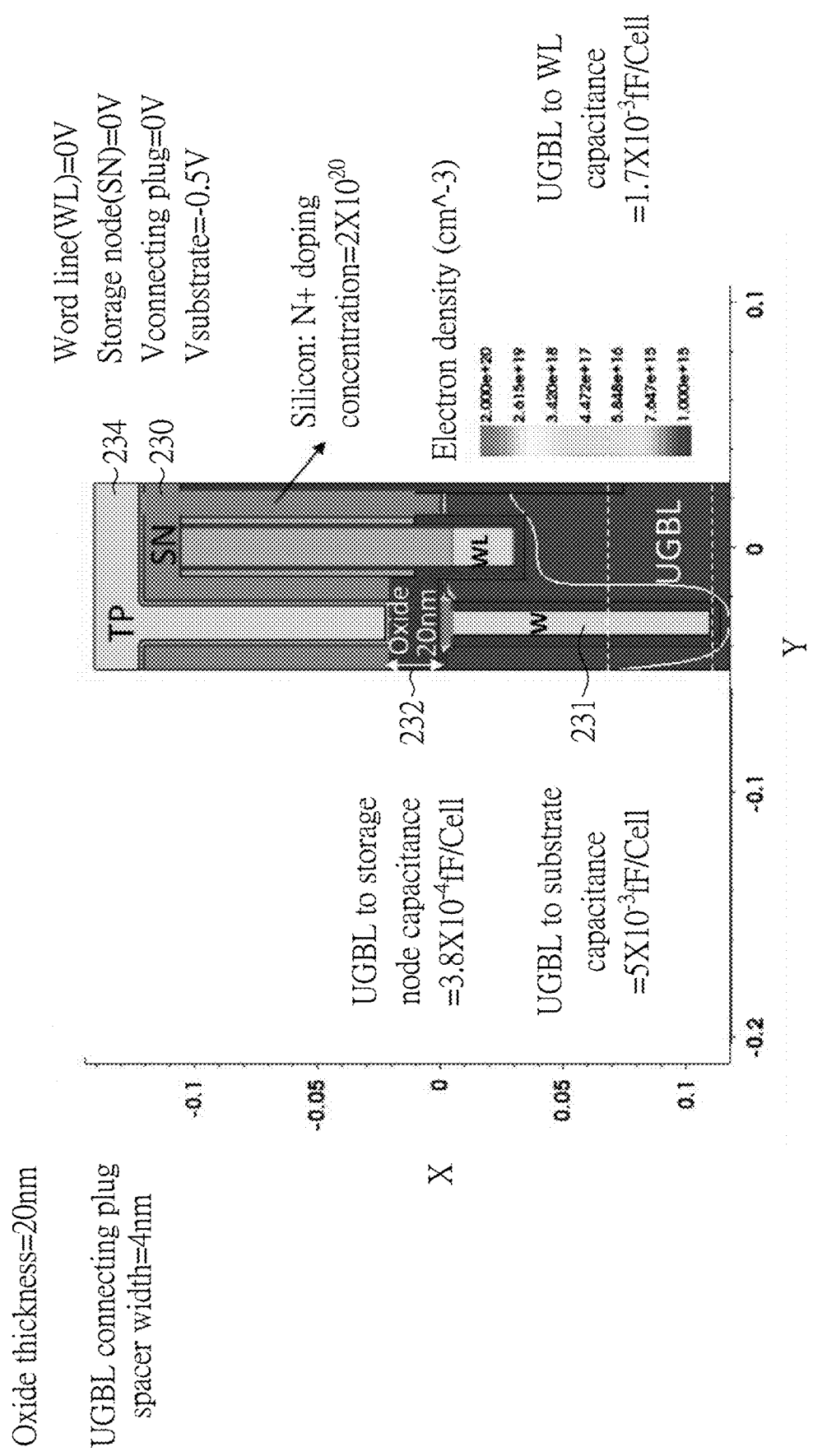
FIG. 2B, FIG. 2C illustrate TCAD simulation results corresponding to capacitances of underground bit line (UGBL) to storage node (SN), UGBL to word line (WL), and UGBL to substrate.

The Technology Computer-Aided Design (TCAD) simulation result in FIG. 2B shows that a capacitance of the bit line UGBL to S-SN (self storage node) 230 per DRAM cell is ~$3.8 \times 10^{-4}$ fF, the capacitance of the bit line UGBL to the P-substrate (can be referred to the semiconductor substrate 200 in FIG. 2A) per DRAM cell is around $5 \times 10^{-3}$ fF, and the capacitance of the bit line UGBL to the word line per DRAM cell is around $1.7 \times 10^{-3}$ fF, under the conditions of: word line voltage=0V; a voltage of the connecting plug 231 made of Tungsten which is connected to the bit line UGBL=0V; the thickness of the spacer (can be referred to the oxide layer 222 shown in FIG. 2A) covering the connecting plug 231 made of Tungsten is 4 nm; a voltage of the SN 230=0V; a voltage of the P-substrate=−0.5V; a thickness of the oxide layer 232 for isolating the heavily doped material (can be referred to the heavily doped material 226 shown in FIG. 2A) from the storage capacitor is 20 nm; the doping concentration of the P-substrate=$5 \times 10^{18}/cm^3$; the electrode of the SN 230 is made of selective growth material (e.g., n+ doped silicon with $2 \times 10^{20}/cm^3$ doping concentration) above the source (such doped silicon electrode will be introduced in FIG. 19), and the top plate 234 of the storage capacitor is made of Tungsten. Due to the increase of depletion region marked by dash line curve in the P-substrate as shown in FIG. 2B, the bit line to word line capacitance per DRAM cell in the present invention is dramatically reduced (e.g. to $1.7 \times 10^{-3}$ fF), as compared with that ($12 \times 10^{-3}$ fF in Table 1) in the conventional DRAM structure.

Moreover, in FIG. 2B, the capacitance of the bit line UGBL to S-SN (Self storage node) is dramatically reduced to ~$3.8\times10^{-4}$ fF as well, as compared with that ($13\times10^{-3}$ fF in Table 1) in the conventional DRAM structure. Due to the symmetry of DRAM array, the capacitance of the bit line UGBL to O-SN (other storage node) per DRAM cell will be substantially the same as that of the bit line UGBL to S-SN (Self storage node) per DRAM cell in the present embodiment.

Figure 2C:
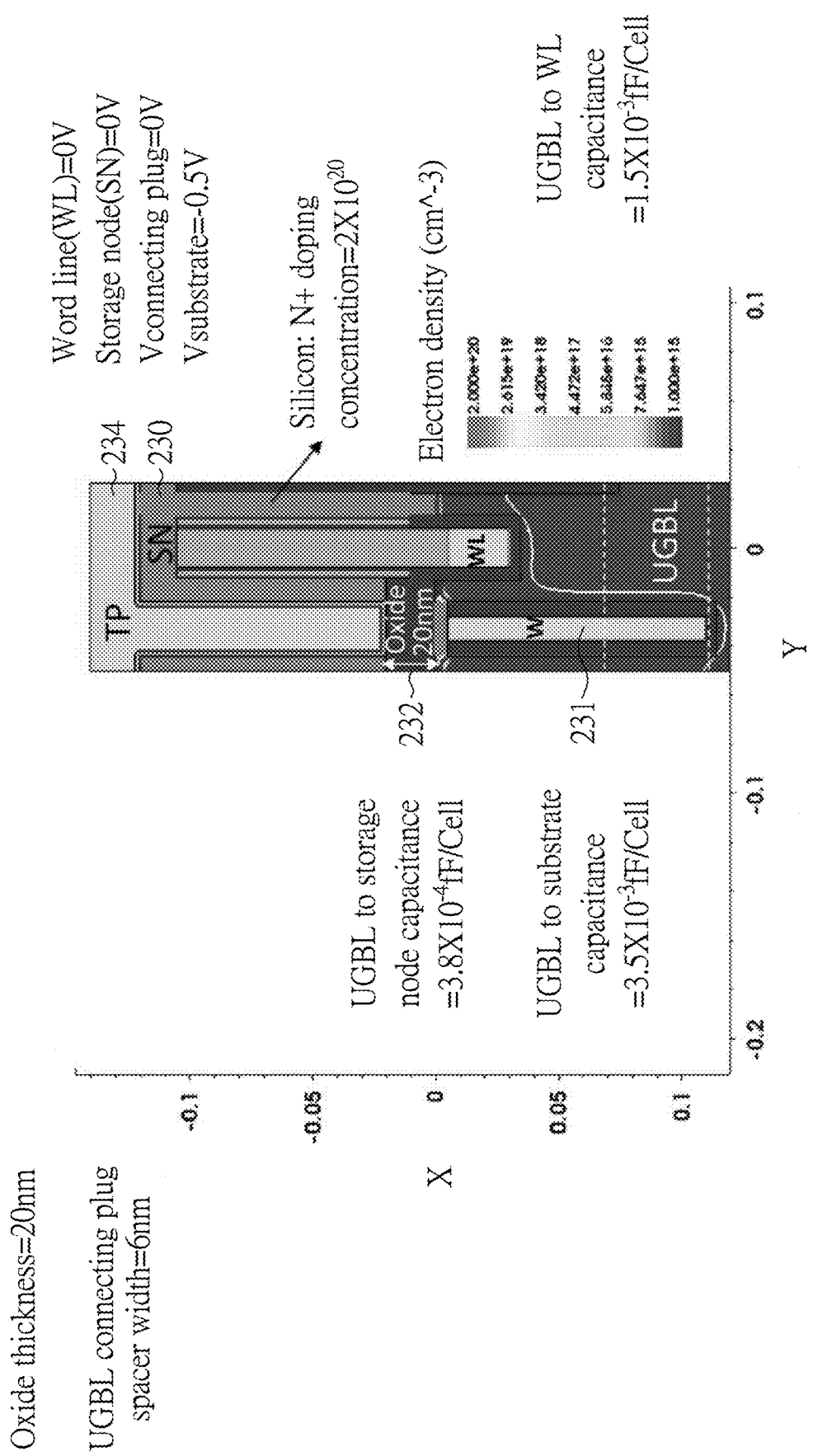

FIG. 2C shows another TCAD simulation result, and the difference of the structures between FIG. 2B and FIG. 2C is that the thickness of the spacer covering the connecting plug made of Tungsten is increased from 4 nm to 6 nm. In such situation, the capacitance of the bit line UGBL to the P-substrate per DRAM cell is reduced from $5\times10^{-3}$ fF to $3.5\times10^{-3}$ fF, and the capacitance of the bit line UGBL to the word line (WL) per DRAM cell is also reduced from $1.7\times10^{-3}$ fF to $1.5\times10^{-3}$ fF.

Figure 2D:
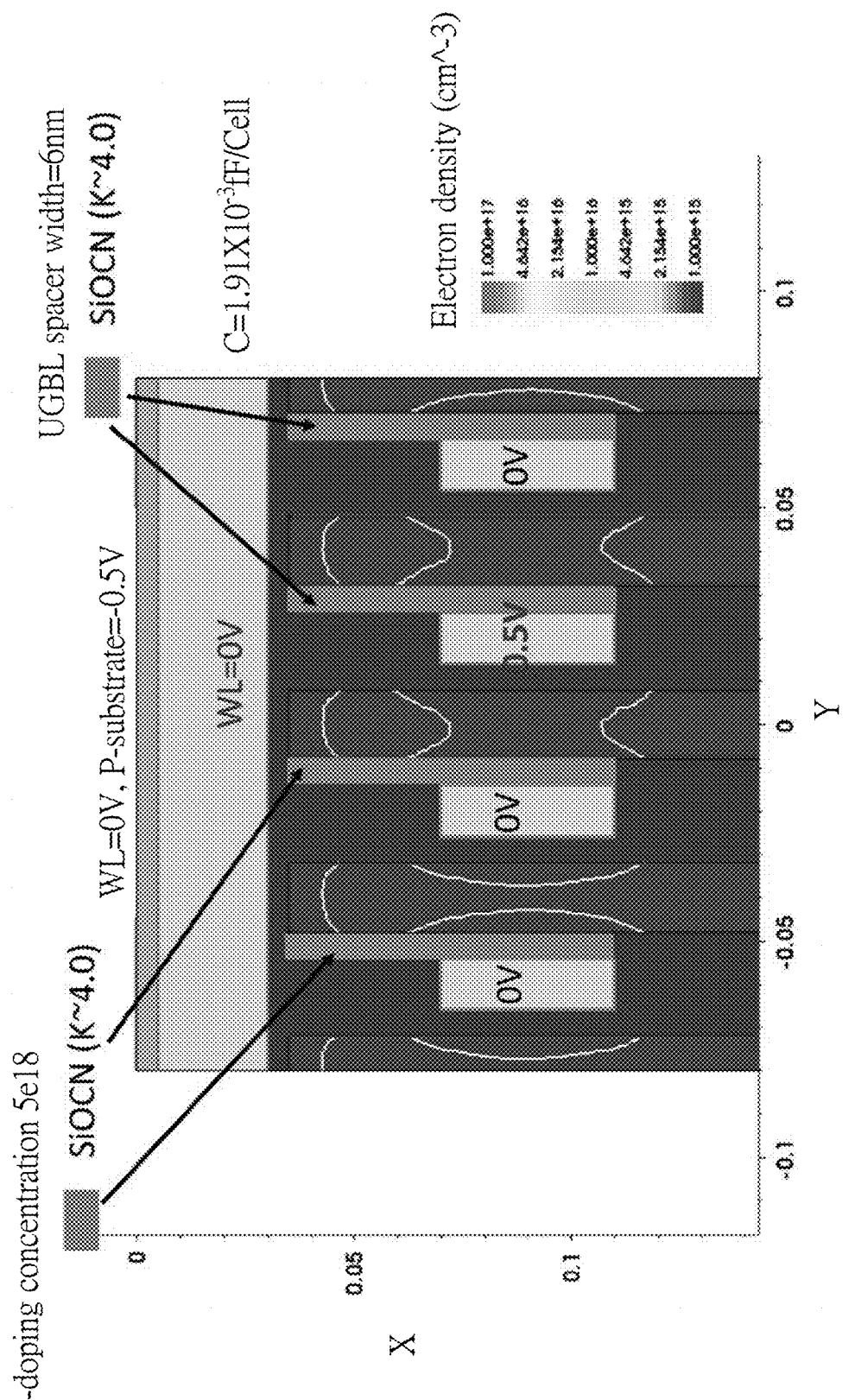
FIG. 2D, FIG. 2E, FIG. 2F, FIG. 2G, FIG. 2H, FIG. 2I illustrate TCAD simulation results corresponding to capacitances of underground bit line (UGBL) to bit line (UGBL).
Figure 2E:
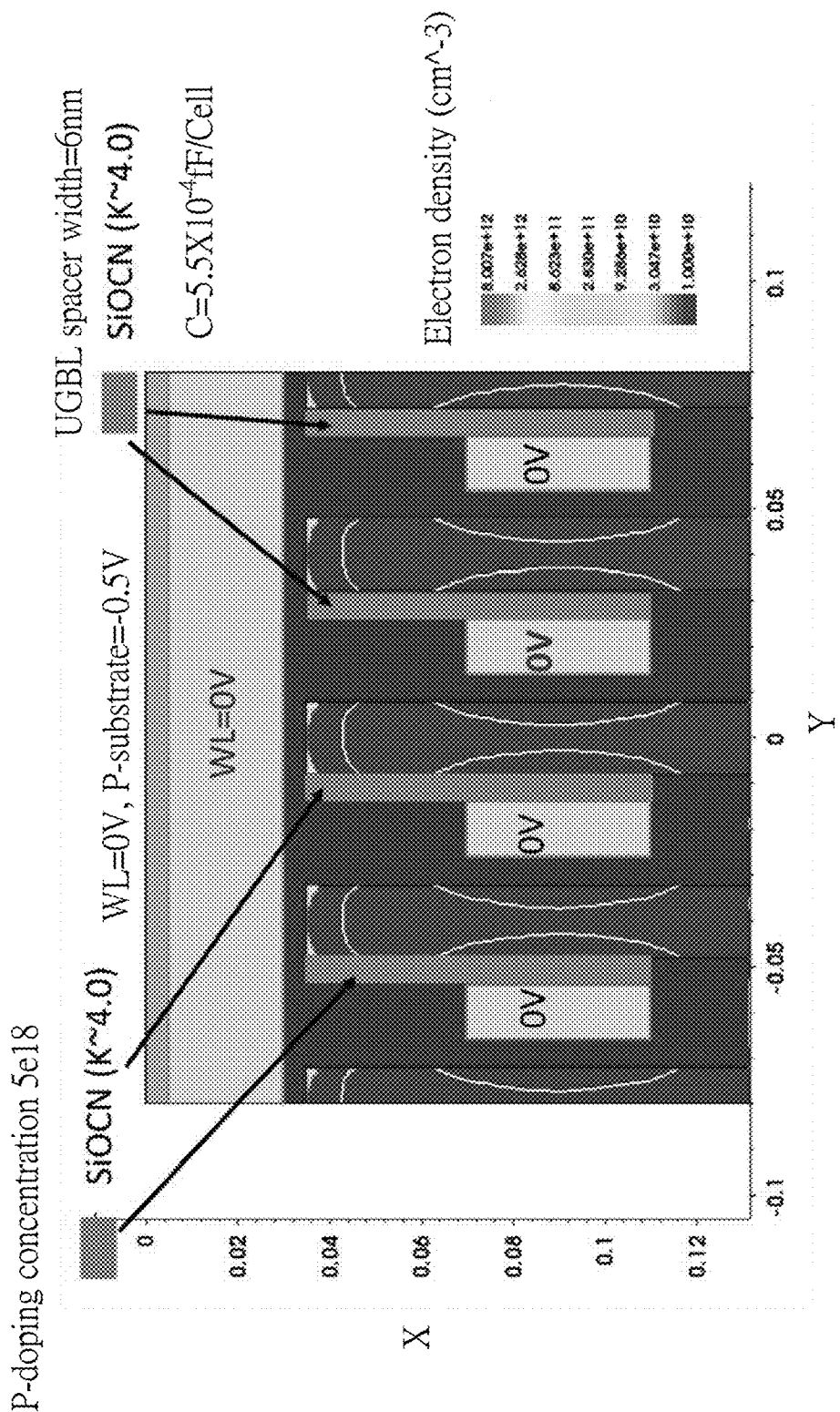
Figure 2F:
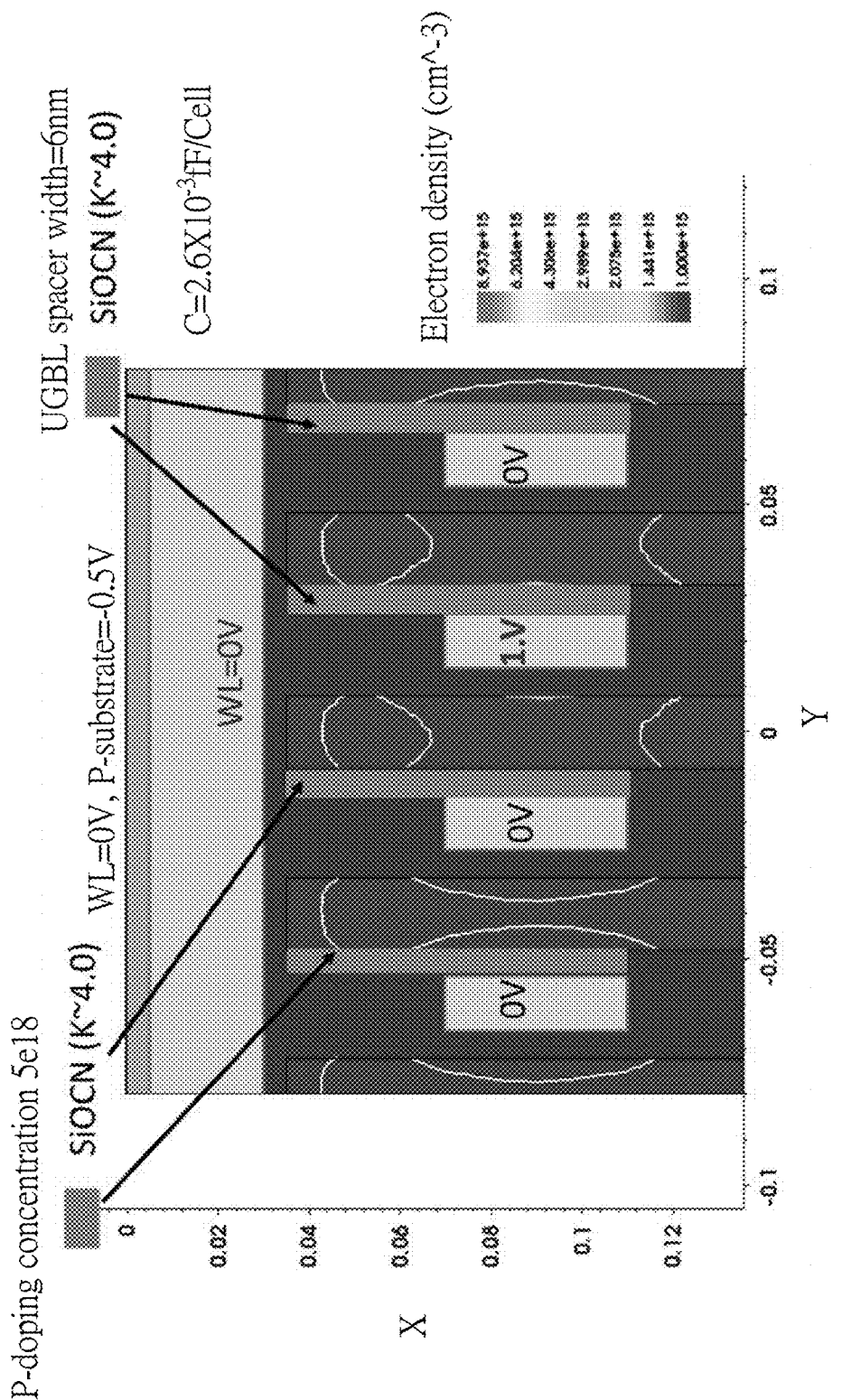
Figure 2G:
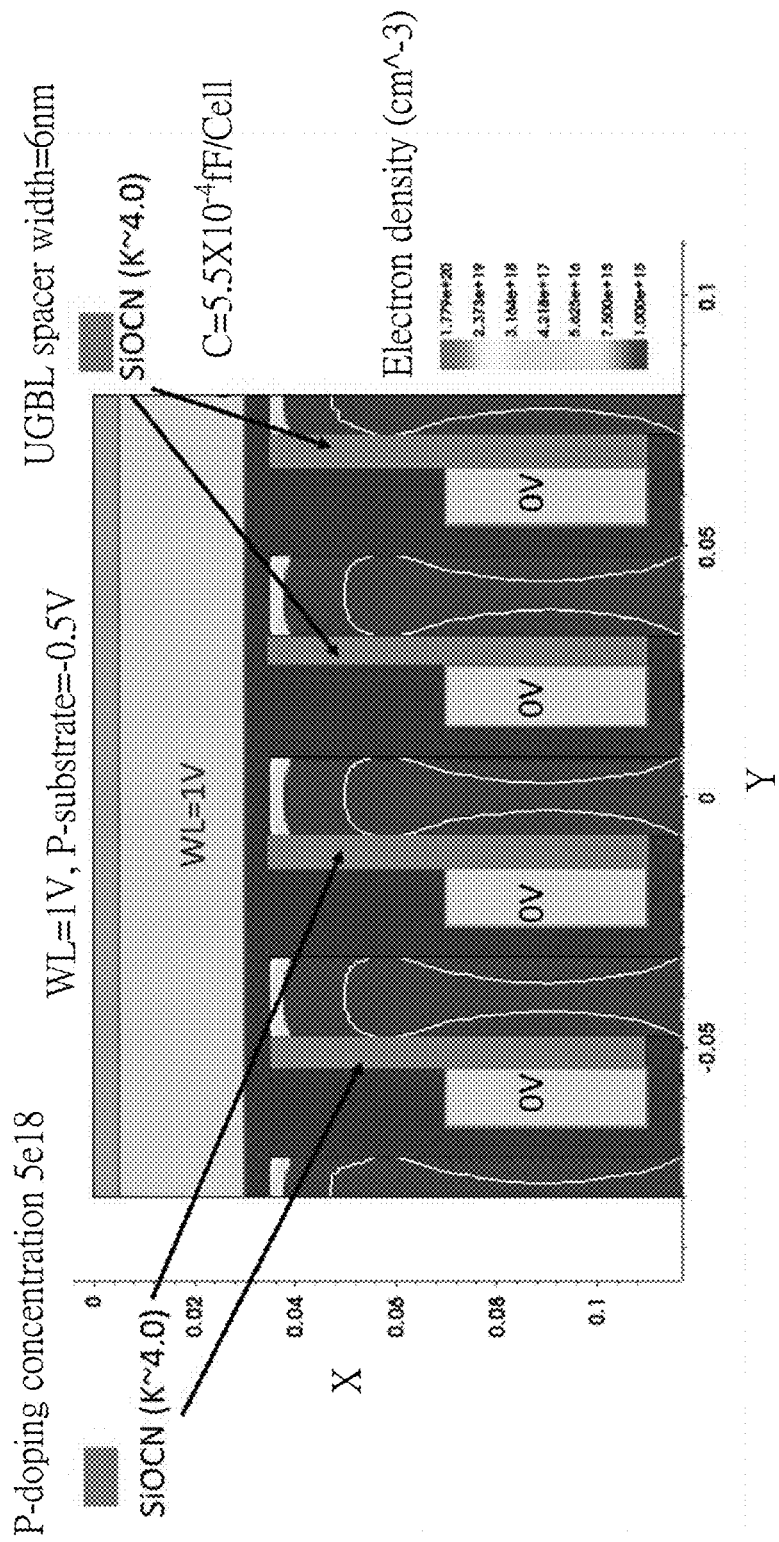
Figure 2H:
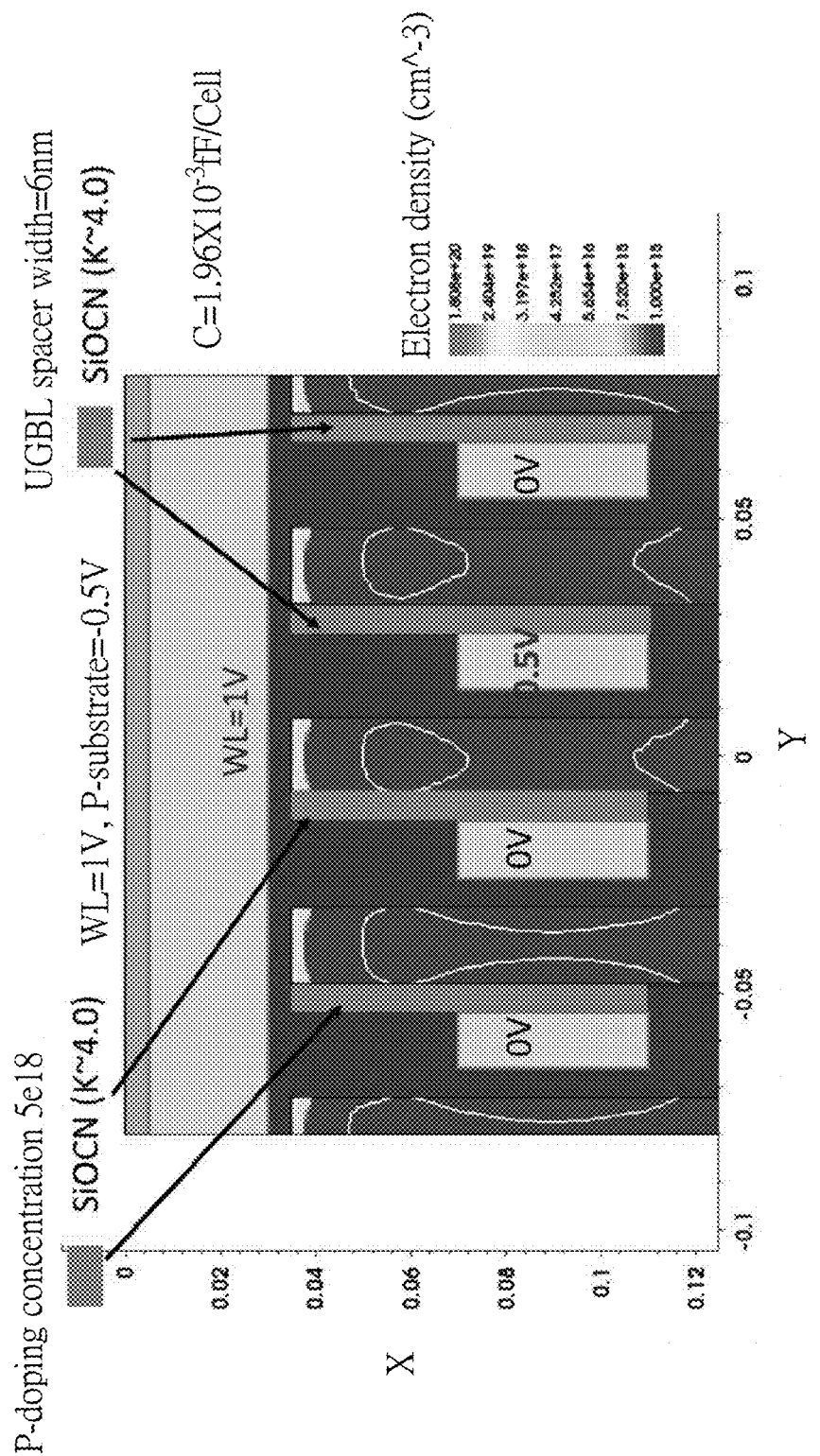
Figure 2I:
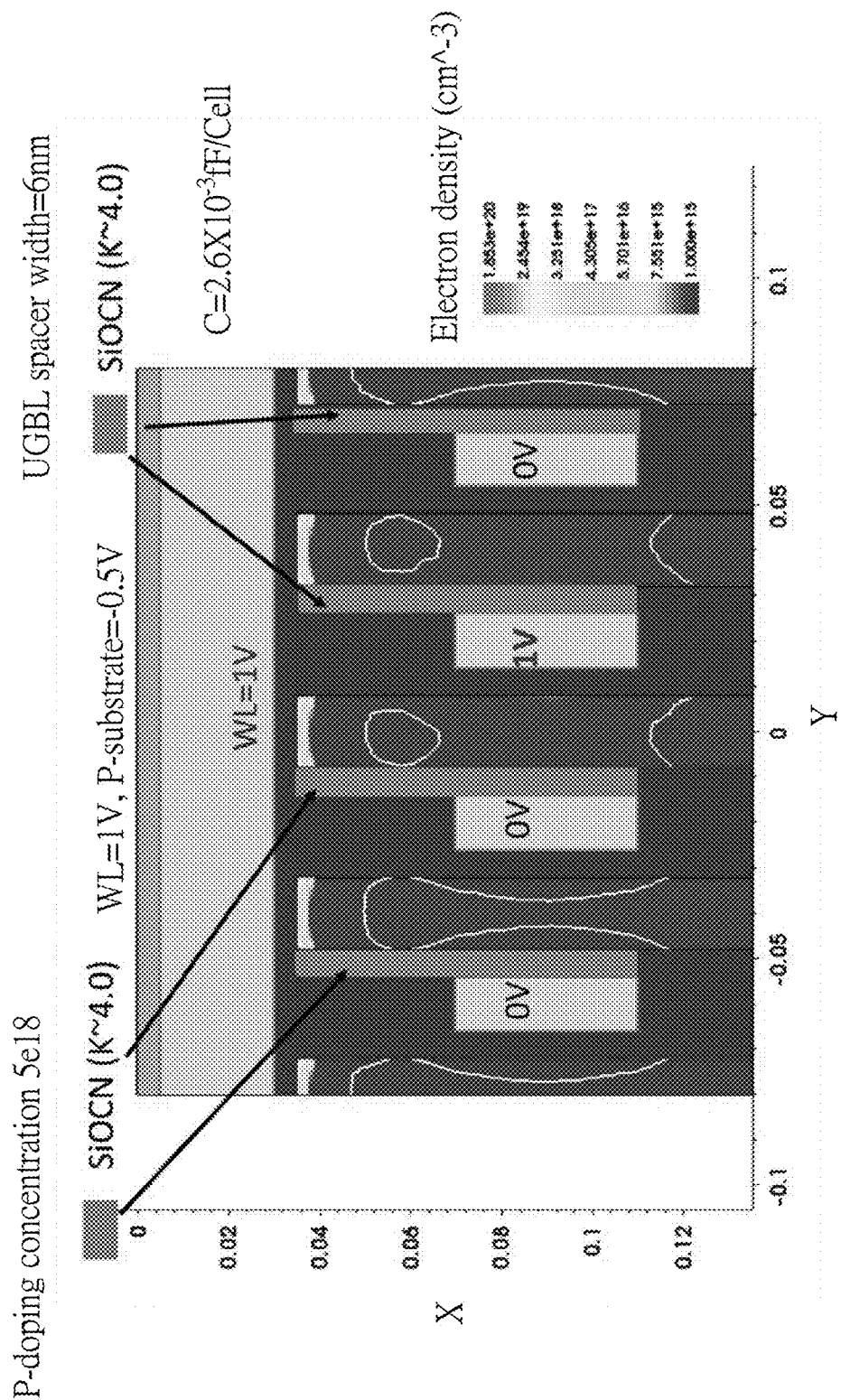

Furthermore, the TCAD simulation result in FIG. 2D describes that the capacitance of the bit line to bit line per DRAM cell is $1.91\times10^{-3}$ fF, under the conditions of: a voltage of the word line=0V; the voltage of one major bit line=0.5V and the voltage of the other bit line=0V; the voltage of the P-substrate=−0.5V; the thickness of the SiOCN (e.g., the dielectric constant K~4.0) covering the second side surface of the bit line is 6 nm; the doping concentration of the P-substrate=$5\times10^{18}/cm^3$. Table 2 summarizes the simulation result for the capacitance of the bit line to bit line per DRAM cell at different word line voltages and major bit line voltages based on the TCAD simulation results in FIGS. 2E, 2F, 2G, 2H, 2I.

TABLE 2

|  | $V_{WL}$ (volt) | $V_{BL}$ (volt) | fF/cell |
| --- | --- | --- | --- |
| $C_{BL}$-$C_{BL}$ | 1 | 0 | $5.5 \times 10^{-4}$(FIG. 2G) |
|  | 1 | 0.5 | $1.96 \times 10^{-3}$(FIG. 2H) |
|  | 1 | 1 | $2.6 \times 10^{-3}$(FIG. 2I) |
| $C_{BL}$-$C_{BL}$ | 0 | 0 | $5.5 \times 10^{-4}$(FIG. 2E) |
|  | 0 | 0.5 | $1.91 \times 10^{-3}$(FIG. 2D) |
|  | 0 | 1 | $2.6 \times 10^{-3}$(FIG. 2F) |

According to the above-mentioned topography and calculations, in the proposed DRAM structure having bit line with very low capacitance, the capacitance of the bit line per DRAM cell with the following components in Table 3 is around $10.06\times10^{-3}$ fF which is approximate to ¼ of the capacitance of the bit line per DRAM cell in the conventional DRAM structure ($40\times10^{-3}$ fF). The capacitance of the bit line per DRAM cell according to the present invention could be even lower by further modification of the proposed DRAM structure.

TABLE 3

| Components | $\times 10^{-3/F}$ |
| --- | --- |
| bit line to bit line | ~2.6 (biggest one in Table 2) |
| bit line to S-SN (Self storage node) | ~0.38 (FIG. 2B) |
| bit line to O-SN (Other storage nodes) | ~0.38 (FIG. 2B) |
| bit line to word line | ~1.7 (FIG. 2B) |
| bit line to substrate | ~5 (FIG. 2B) |
| Total | 10.06 |

Figure 3:
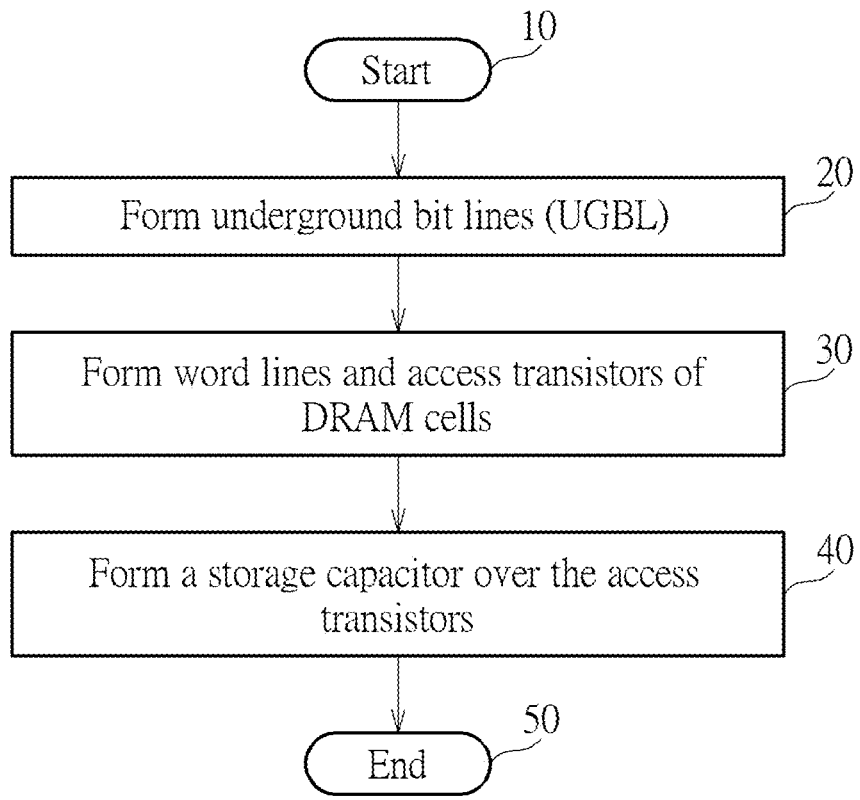
FIG. 3 is a flowchart illustrating a manufacturing method of semiconductor memory structure having bit line with low capacitance according to an embodiment of the present invention.

Please refer to FIG. 3, wherein FIG. 3 is a flowchart illustrating a manufacturing method of semiconductor memory structure having bit line with low capacitance according to an embodiment of the present invention.

Step 10: Start.
Step 20: Form underground bit lines (UGBL).
Step 30: Form word lines and access transistors of DRAM cells.
Step 40: Form a storage capacitor over the access transistors.
Step 50: End.

Figure 4:
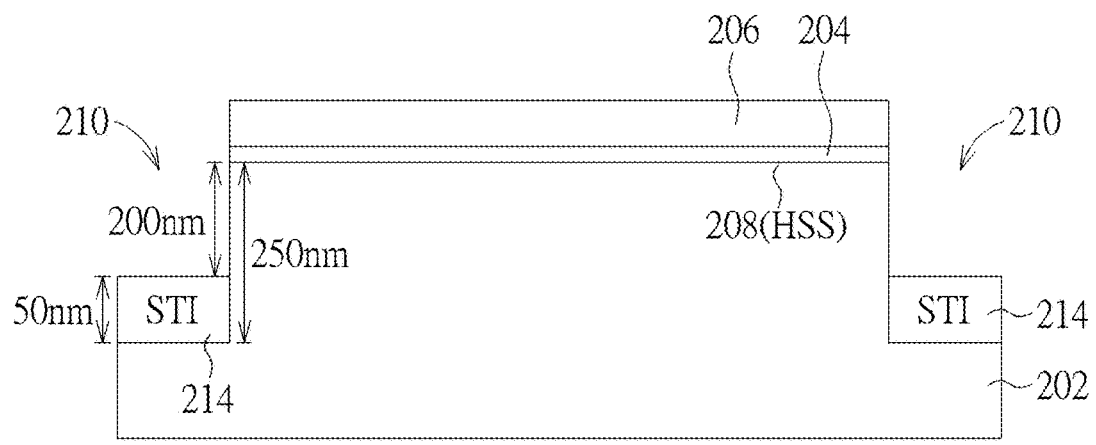
FIG. 4, FIG. 5, FIG. 6, FIG. 7 illustrate forming underground bit line.
Figure 4:
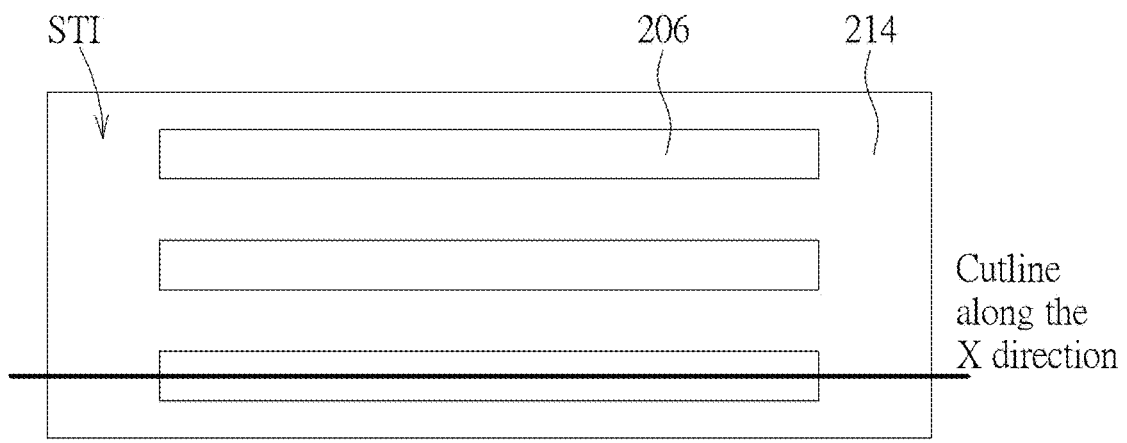

Step 20: Form Underground Bit Lines (UGBL):

Detailed description of the aforesaid manufacturing method is as follows. Start with a p-type silicon wafer (i.e. the p-type substrate 202). As shown in FIG. 4(a), the pad-oxide layer 204 is formed above a horizontal surface 208 (i.e. named as a horizontal silicon surface (HSS), or original semiconductor surface (OSS)) and then the pad-nitride layer 206 is deposited above the pad-oxide layer 204.

As shown in FIG. 4(a), the active regions of the DRAM cell array can be defined by the photolithographic mask technique. Because the horizontal silicon surface 208 outside the active region pattern is exposed, the parts of the silicon material corresponding to the horizontal silicon surface 208 outside the active region pattern can be removed by an anisotropic etching technique to create the trench (or canal) 210, wherein for example, the trench 210 can be 250 nm deep below the HSS.

As shown in FIG. 4(a), the oxide layer 214 is deposited to fully fill the trench 210 and then the oxide layer 214 is etched back such that the shallow trench isolation (STI) inside the trench 210 is formed below the HSS. In addition, FIG. 4(b) is a top view corresponding to FIG. 4(a), wherein FIG. 4(a) is a cross-section view along a cutline of an X direction shown in FIG. 4(b). In addition, as shown in FIG. 4(a), for example, the STI has a thickness about 50 nm and a top of the STI is about 200 nm deep below the HSS if the trench 210 is 250 nm deep below the HSS.

Figure 5:
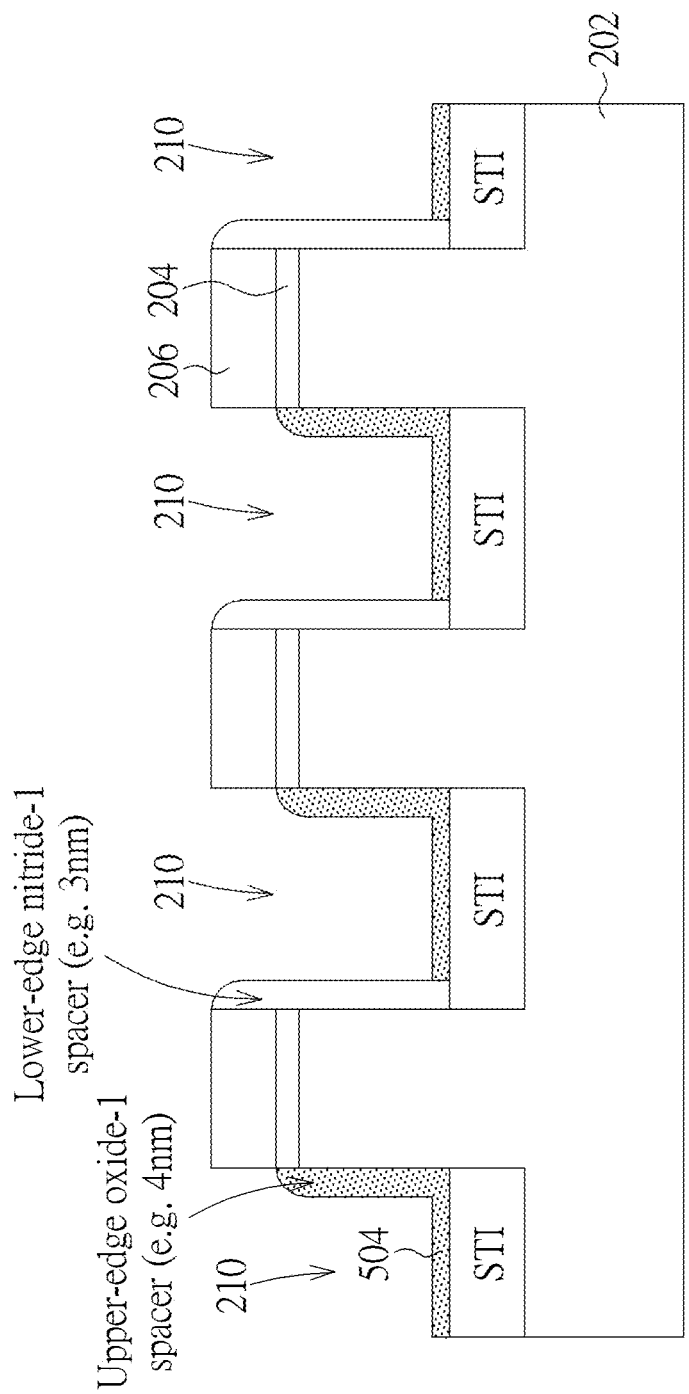

As shown in FIG. 5, then form asymmetric spacers on two symmetrical edges of the trench 210, for example, using the photolithographic mask, the nitride-1 (or other low K dielectric material, such as SiOCN) spacer (e.g. 3 nm) of the asymmetric spacers is first formed along a lower edge of the two symmetrical edges of the trench 210, and then the oxide-1 spacer (e.g. 4 nm) of the asymmetric spacers is formed along an upper edge of the two symmetrical edges of the trench 210. Therefore, as shown in FIG. 5, the nitride-1 spacer and the oxide-1 spacer cover the lower edge and the upper edge of the trench 210, respectively. A structure of the asymmetric spacers (shown in FIG. 5) is named as asymmetric spacers on two symmetrical edges of a trench. In addition, as shown in FIG. 5, the STI may have only much thinner oxide layer (called as an oxide-1/STI layer 504) added over it. In addition, FIG. 5 is a cross-section view along the Y direction.

Figure 6:
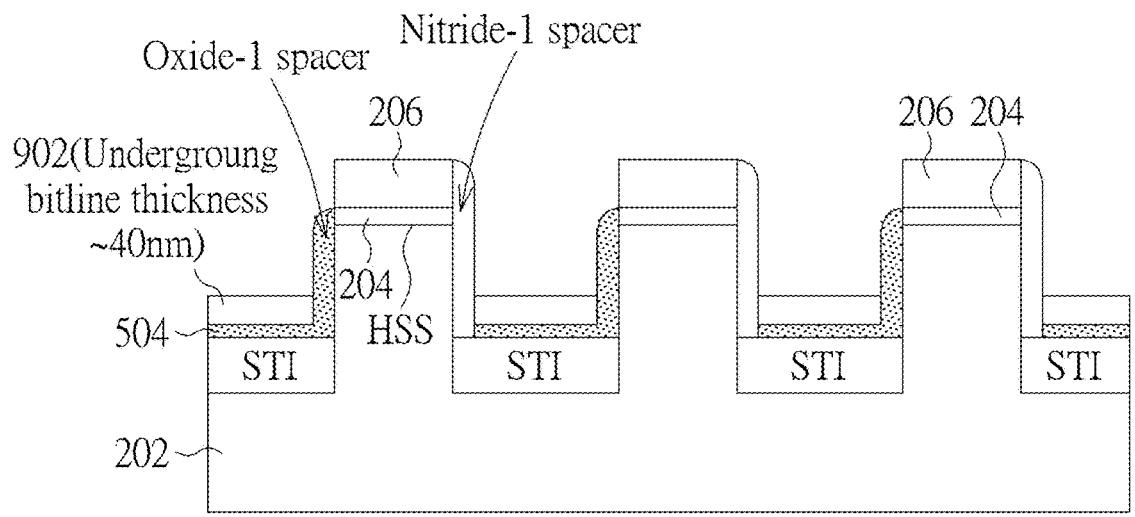
Figure 6:
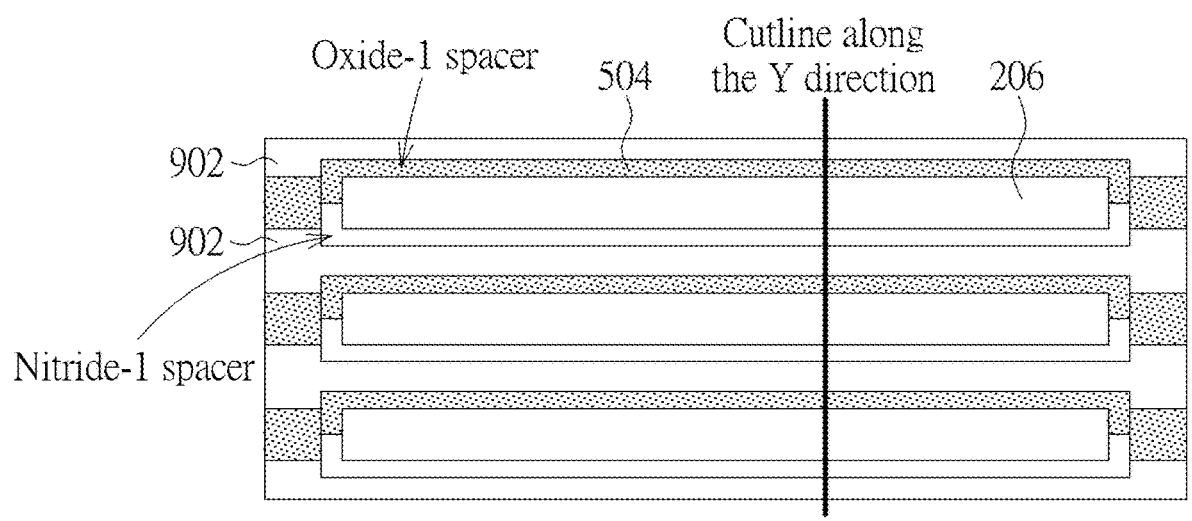

Afterward, as shown in FIG. 6(a), the metal layer (or a conductive material) which needs to sustain the subsequent processing conditions is deposited to form the underground bit line ("UGBL") 902 in the trench 210. In addition, in one embodiment of the present invention, the underground bit line (UGBL) 902 can be Tungsten which is abbreviated as W, wherein a top of the underground bit line 902 is much lower than the HSS (e.g., a thickness of the underground bit line 902 is about 40 nm). In addition, as shown in FIG. 6(a), the underground bit line (UGBL) 902 is on the top of the STI and both sidewalls of the underground bit line (UGBL) 902 are bounded by the asymmetric spacers, that is, the lower edge nitride-1 spacer and the oxide-1 spacer, respectively. In addition, FIG. 6(b) is a top view corresponding to FIG. 6(a), wherein FIG. 6(a) is a cross-section view along a cutline of the Y direction shown in FIG. 6(b). It is clear that the underground bit line ("UGBL") 902 extended along a canal or trench 210 between two active regions covered by the pad-nitride layers 206.

Figure 7:
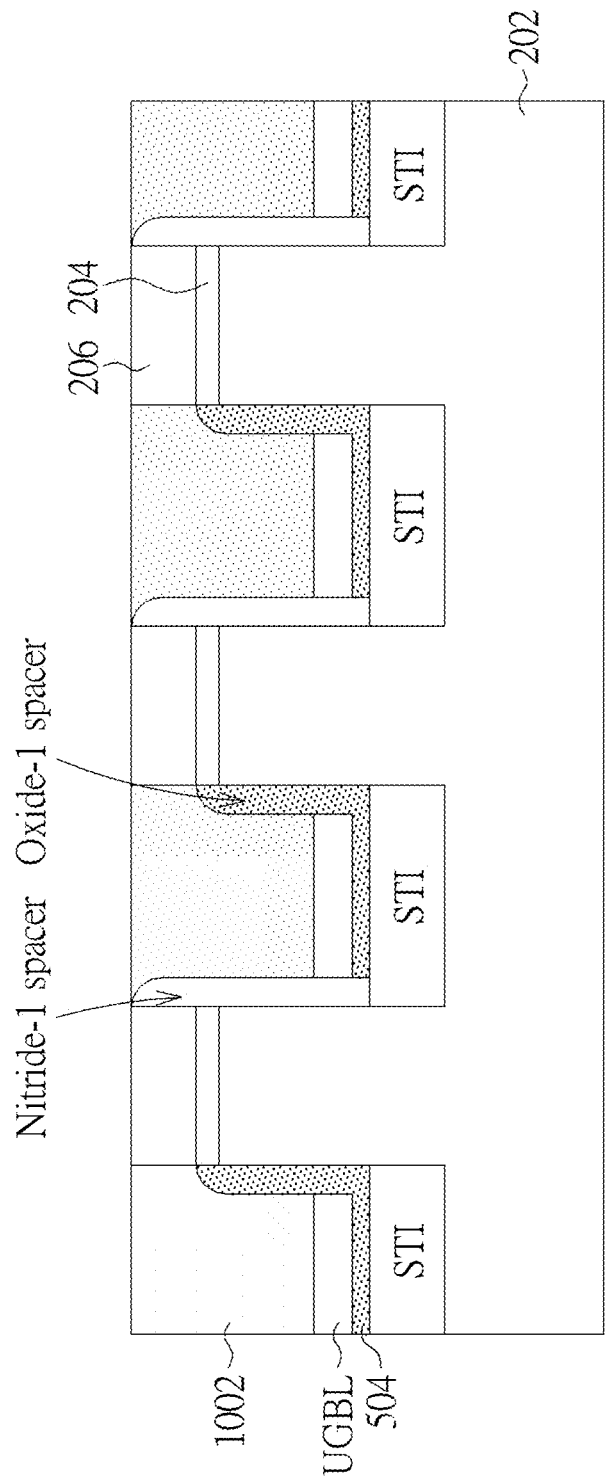

Then, as shown in FIG. 7 (the cross-section view along the Y direction shown in FIG. 6(b)), the oxide-2 layer 1002 (called as CVD-STI-oxide2) needs to be thick enough to fill the trench 210 over the underground bit line 902, and then the oxide-2 layer 1002 is polished back to reserve some part which is leveled as high as the top of the pad-nitride layer 206, wherein the oxide-2 layer 1002 is bounded by the pad nitride layer 206/the pad oxide layer 204 and covers both the lower edge nitride-1 spacer and the oxide-1 spacer. As shown in FIG. 7, the underground bit line 902 (i.e. an interconnection line) can be embedded and bounded by all insulators (i.e. an isolation region) inside the trench 210 (and later the underground bit line 902 will be connected to drains of access transistors of the DRAM cell array) which is named as underground bit-lines (UGBL) surrounded by insulators.

Step 30: Form Word Lines and Access Transistors of DRAM Cells:

The following descriptions introduce how to form both the access transistors and word lines of the DRAM cells (1T1C cell) and the word lines connect all associated gate structures of the access transistors simultaneously by a self-alignment method and thus both the gate structures and the word lines are connected as one body of metal such as Tungsten (W).

Figure 8:
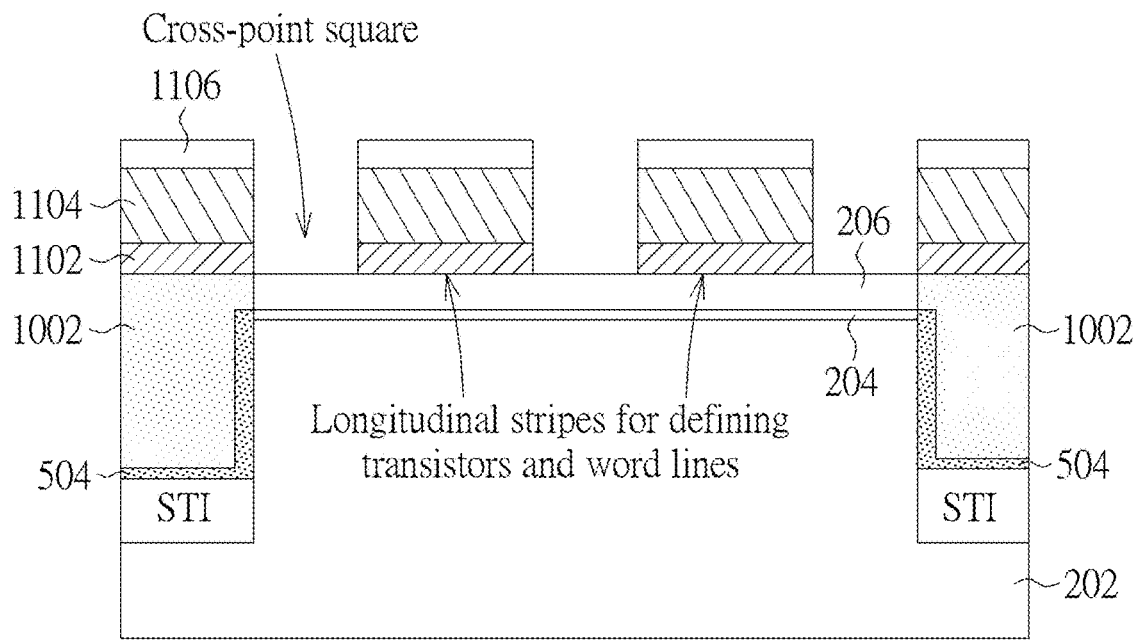
FIG. 8, FIG. 9, FIG. 10, FIG. 11, FIG. 12, FIG. 13, FIG. 14.
Figure 8:
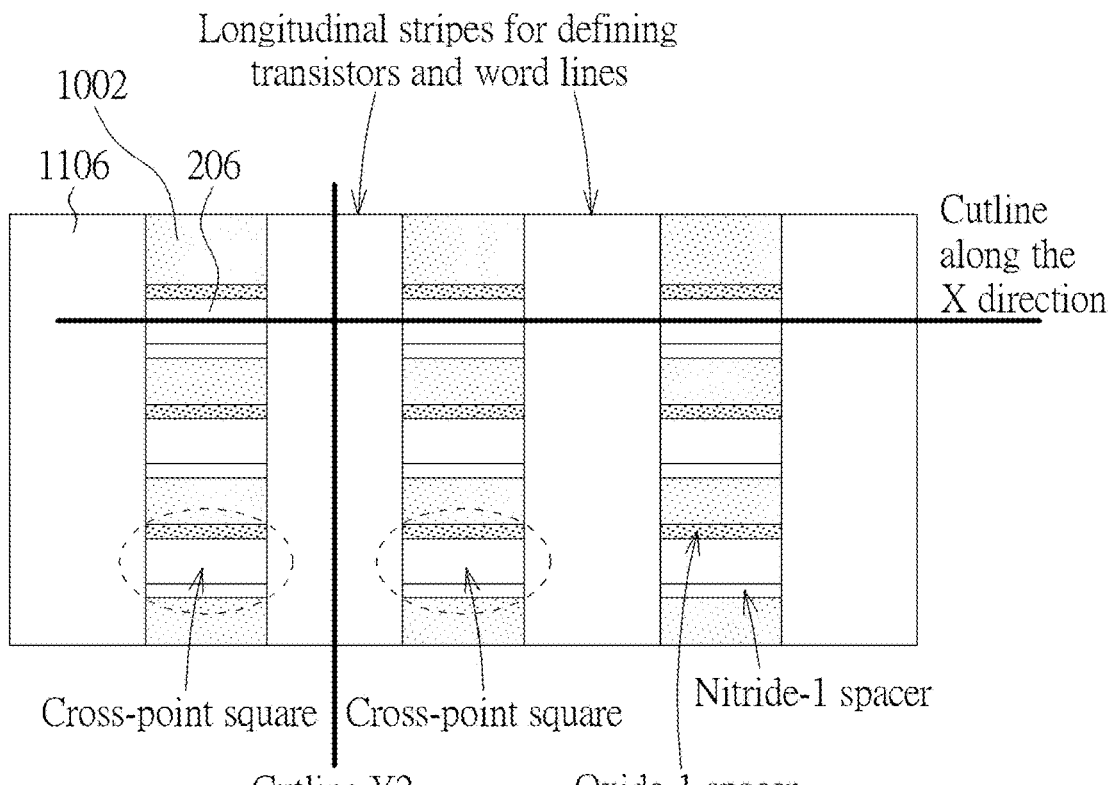

Then, as shown in FIG. 8(a), first, the thick oxide-3 layer 1102, the thick nitride-2 layer 1104, and the patterned photoresist 1106 are deposited. Then, the unnecessary parts of the oxide-3 layer 1102 and the nitride-2 layer 1104 are removed by using etching technique. A transistor/word line pattern will be defined by the composite layers of the oxide-3 layer 1102 and the nitride-2 layer 1104, wherein the composite layers of the oxide-3 layer 1102 and the nitride-2 layer 1104 includes multiple stripes in a direction perpendicular to a direction of the active region. Therefore, as shown in FIG. 8(a) and FIG. 8(b), longitudinal (the Y direction) stripes (the oxide-3 layer 1102 and the nitride-2 layer 1104) for defining the access transistors and word lines are formed, wherein the active region is located at cross-point square between the longitudinal stripes, wherein FIG. 8(a) is a cross-section view along the cutline of the X direction shown in FIG. 8(b).

As shown in FIG. 8(b), a top view reveals fabric-like checkerboard patterns with the longitudinal stripes of the oxide-3 layer 1102 and the nitride-2 layer 1104 over the pad-nitride layer 206 and the pad-oxide layer 204, and both the active region and the STI are in a horizontal direction (i.e. the X direction shown in FIG. 8(b)). The active region allows the access transistors to be made by a kind of a self-alignment technique.

Figure 9:
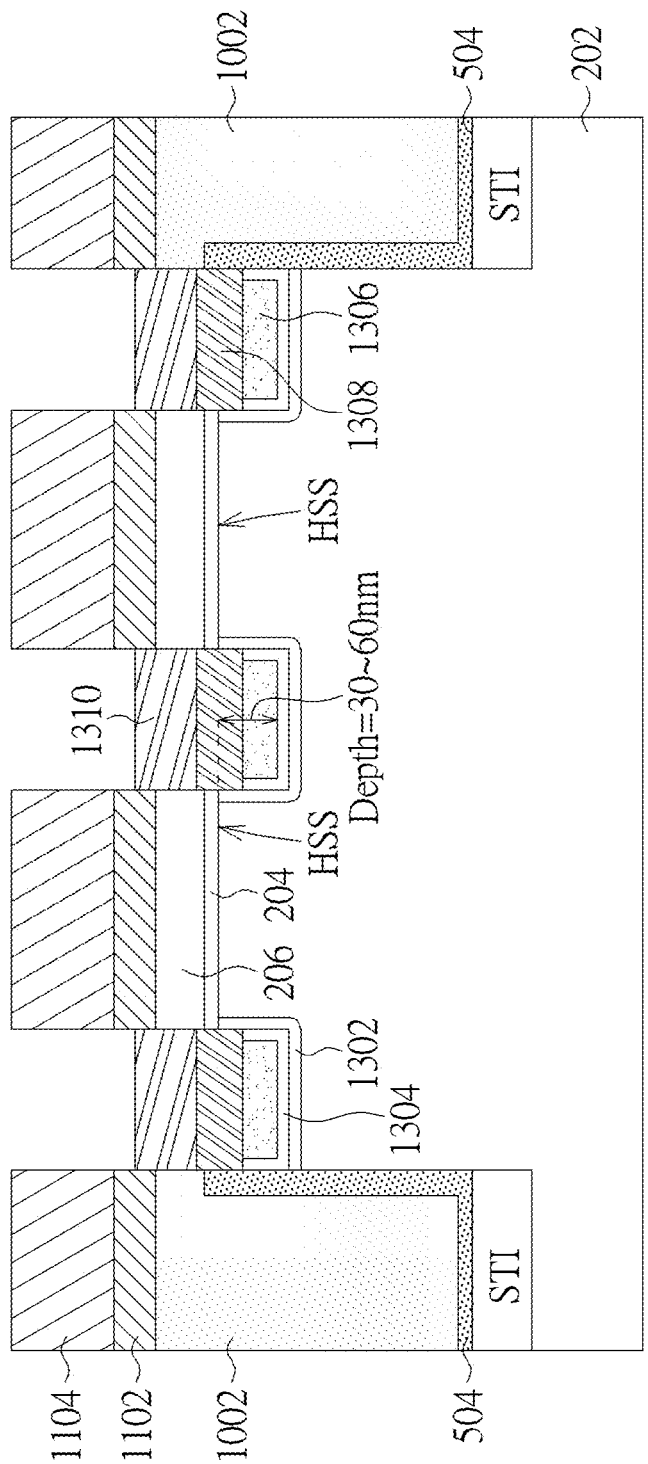

Then, as shown in FIG. 9, the HSS exposed at the cross-point squares is etched by the anisotropic etching technique to create the concave (such as U-shape), wherein the U-shaped concave is for a U-shaped channel 1302 of the access transistor, and for example, a vertical thickness of the U-shaped concave from the horizontal silicon surface (HSS) can be around 30~60 nm. Then, form a layer of the high-k insulator layer 1304 as the gate dielectric of the access transistor, select a suitable gate conductive material (Tungsten, W) 1306 that is appropriate for the word line/the gate and deposit such material in the vacancies between two adjacent longitudinal stripes (the oxide-3 layer 1102 and the nitride-2 layer 1104) to form the word lines and the recess gate of the access transistor. In one example, the top of the gate material 1306 is lower than the HSS of the p-type substrate 202. Furthermore, sequentially deposit SiOCN layer 1308 and oxide layer 1310 (or other composite dielectric layers) on the gate material 1306 to form the gate cap layer.

As shown in FIG. 9, the newly proposed access transistor (hereafter called as U-transistor) with the U-shaped channel 1302 is different from a recessed transistor commonly used in the state-of-the-art buried word line design. The U-transistor has its body with two sides bounded by the CVD-STI-oxide2 1002 along the Y direction (i.e. a channel width direction) and its channel length including a depth of one edge of the U-shaped channel 1302 on a side corresponding to a drain of the U-transistor, a length of a bottom of the U-shaped channel 1302, and a depth of another edge of the U-shaped channel 1302 on a side corresponding to a source of the U-transistor.

Figure 10:
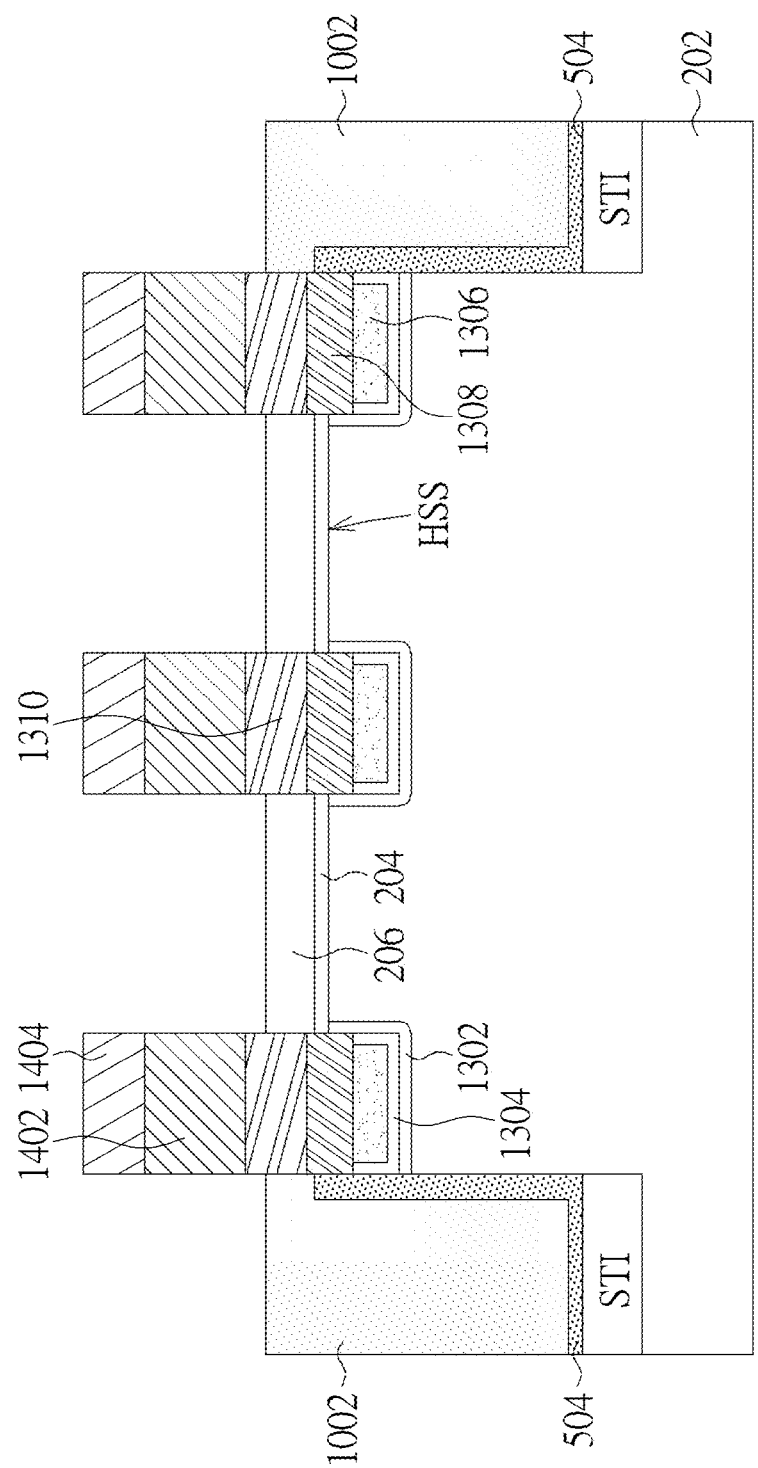

As shown in FIG. 10, the nitride-3 layer 1402 (i.e. dielectric cap) is deposited and the oxide-4 layer 1404 is subsequently deposited, wherein the nitride-3 layer 1402 and the oxide-4 layer 1404 are stacked up with total thickness being large enough to fill the vacancy between the two adjacent longitudinal stripes (the oxide-3 layer 1102 and the nitride-2 layer 1104). Then, the oxide-4 layer 1404 is etched back (or polished back) to be leveled off to a top of the nitride-2 layer 1104 so as to form a composite stack composed of the oxide-4 layer 1404 and the nitride-3 layer 1402 directly above the word line (i.e. the gate material 1306).

Then, as shown in FIG. 10, the nitride-2 layer 1104 is etched away by the anisotropic etching technique and the oxide-4 layer 1404/the nitride-3 layer 1402 are left above the word line. Then, the oxide-3 layer 1102 is also etched away by the anisotropic etching to expose the pad-nitride layer 206. The gate structure (such as, the oxide-4 layer 1404/the nitride-3 layer 1402/the gate material 1306) is achieved for both the gate of the U-transistor inside the U-shaped concave and the word line in the longitudinal direction (i.e. the Y direction).

Figure 11:
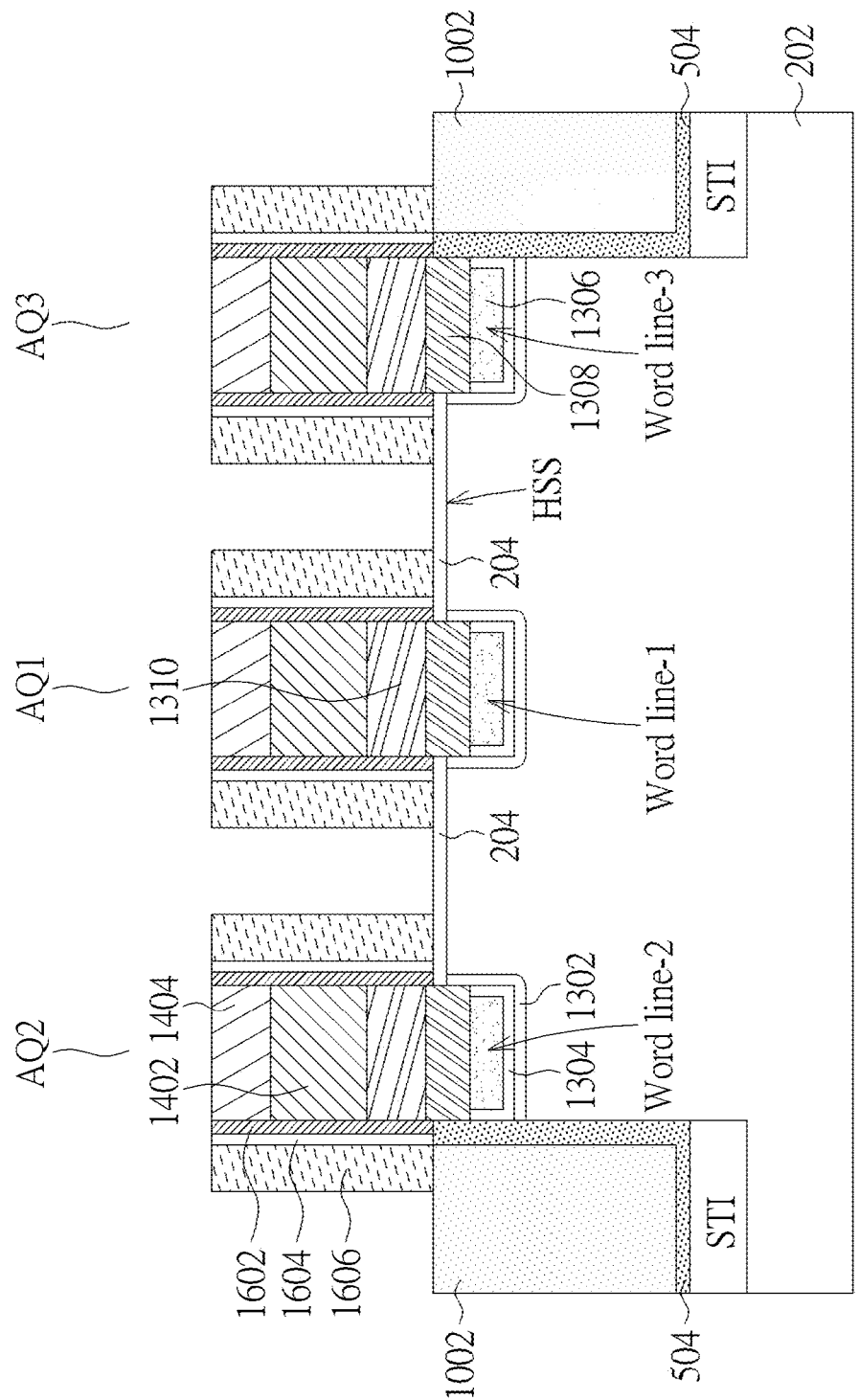

As shown in FIG. 11, the pad-nitride layer 206 is removed everywhere to leave the pad-oxide layer 204. The CVD-STI-oxide2 (i.e., the oxide-2 layer 1002) is etched back to be leveled as high as the top of the pad-oxide layer 204. Then, the nitride-4 layer 1602 is deposited and etched by the anisotropic etching technique to create a nitride-4 spacer with well-designed suitable thickness. Then, the oxide-5 layer 1604 is deposited and etched by the anisotropic etching technique to create an oxide-5 spacer. Then, the polysilicon-1 layer 1606 (i.e. intrinsic and undoped) is deposited over the entire surface and etched by the anisotropic etching technique to create polysilicon-1 spacer to make the polysilicon-1 spacer surround word lines (e.g. word line-1, word line-2, word line-3). Therefore, in summary, there are the polysilicon-1 spacer outside the oxide-5 spacer and the nitride-4 spacer, and all the above-mentioned spacers surround and along the sidewalls of gate structure.

As shown in FIG. 11, for convenience and clarity of describing the DRAM cell array with word lines and bit lines, the word line located at a center is labeled the word line-1 (corresponding to the access transistor AQ1), the word line next to a left side of the word line-1 is labeled the word line-2 (corresponding to an access transistor AQ2 next to a left side of the access transistor AQ1), and drain region (drain-1 and drain-2) between the word line-1 and the word line-2 still covered by the pad-oxide layer 204 are reserved for the drain of the access transistor AQ1 and a drain of the access transistor AQ2. The word line next to a right side of the word line-1 is labeled the word line-3 (corresponding to an access transistor AQ3 next to a right side of the access transistor AQ1), and source region (source-1 and source-3) between the word line-1 and the word line-3 still covered by the pad-oxide layer 204 are reserved for the source of the access transistor AQ1 and a source of the right access transistor AQ3.

Figure 12:
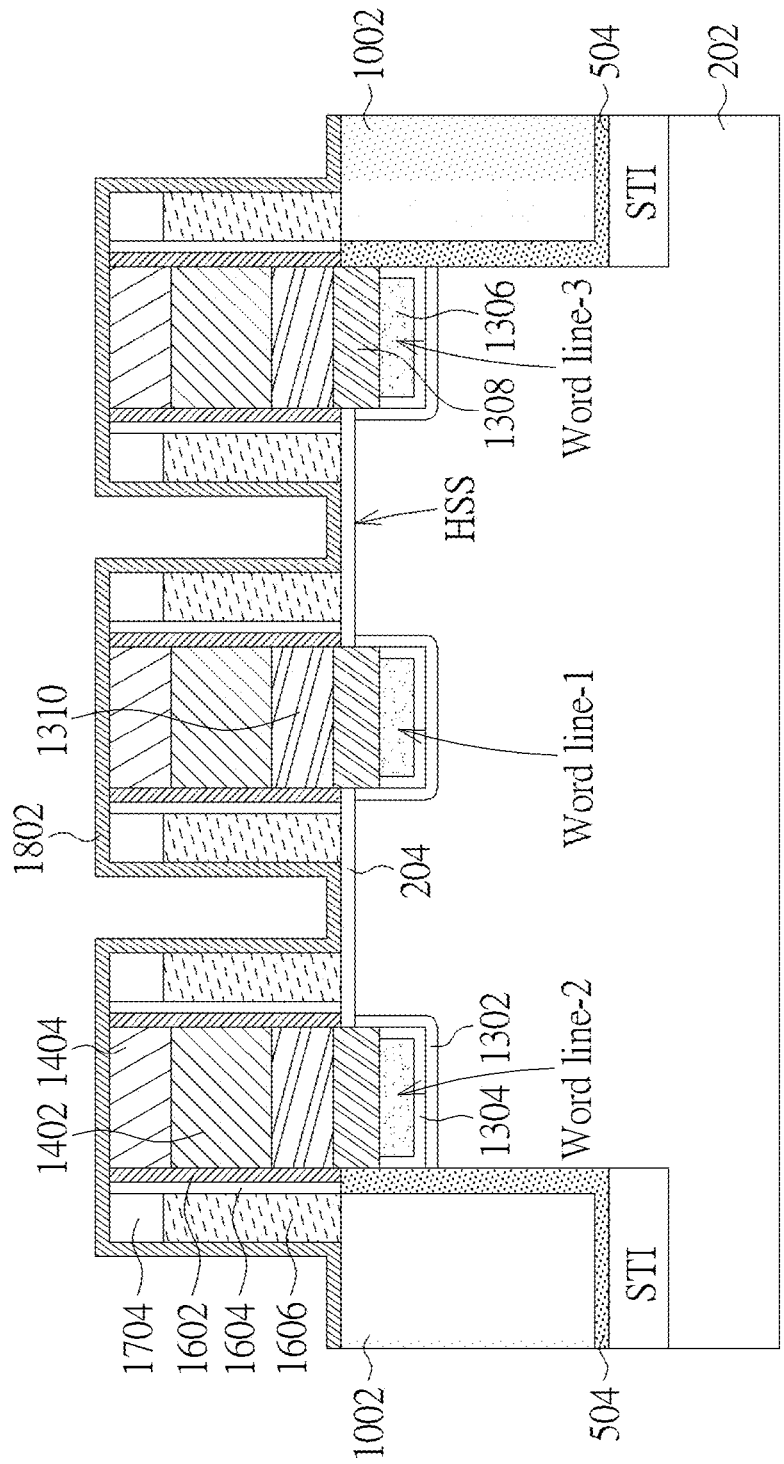

Then, deposit a spin-on dielectrics (SOD) which is thick enough to fill into the vacancies (corresponding to the drain region and the source region) among the word lines and then polish back the SOD to a flat level with a top of the oxide-4 layer 1404 by the CMP technique. Then, some upper part of the polysilicon-1 spacer is etched by the anisotropic etching technique. Then, the cap-oxide-1 layer 1704 is deposited to fill in vacancies on top of the polysilicon-1 spacer and then planarized by the CMP technique to be leveled as high as to the top of the oxide-4 layer 1404. Then, as shown in FIG. 12, the SOD is etched away, wherein the SOD has a much higher etching rate than that of deposited or thermally grown oxide layers for them to be kept well. Then, the nitride-5 layer 1802 is deposited over an entire surface shown in FIG. 12.

Then, deposit the SOD 1902 which is thick enough to fill into the vacancies among all word lines and then polish back the SOD 1902 to a flat level with a top of the nitride-5 layer 1802. Then, apply a photoresist layer on the flat surface to cover an area reserved for the drain region (i.e. the drain-1 and the drain-2) and to expose an area reserved for the source region (i.e. the source-1 and the source-3). Then, remove the SOD 1902 corresponding to the areas reserved for the source region by utilizing the nitride-5 layer 1802 surrounding all word lines as a self-alignment mask.

Then, the exposed nitride-5 layer 1802 and the pad-oxide layer 204 at a center of the source region between two word lines (the word line-1 and the word line-3) are etched away so as to expose the HSS. Because the exposed HSS is located between the source-1 of the access transistor AQ1 and the source-3 of the access transistor AQ3, the exposed HSS between the source-1 and the source-3 can be called as HSS-1/3.

Figure 13:
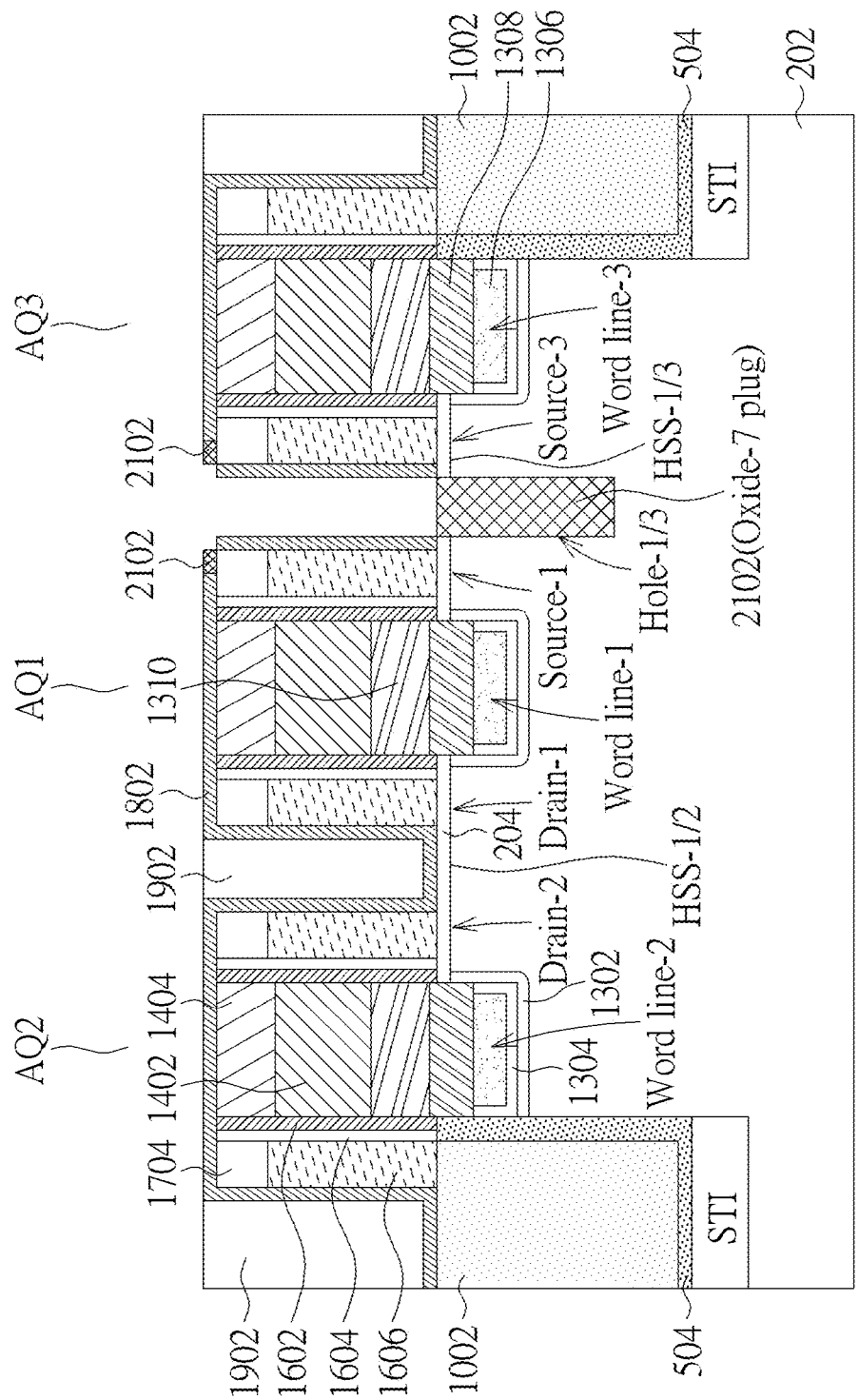

As shown in FIG. 13, utilize anisotropic etching technique to dig and remove the silicon material (corresponding to the center of the source region) below the HSS-1/3 to generate the hole-1/3 which is surrounded by the lower edge nitride-1 spacer and the oxide-1 spacer on two opposite sides (not shown in FIG. 13) and by the p-type substrate 202 on the other two opposite sides, respectively.

Then, remove the photoresist, thermally grow the oxide-7 layer 2102 to fill the hole-1/3 (or deposit suitable dielectric material), and the oxide-7 layer 2102 could be also grown partially on a top of the cap-oxide-1 layer 1704 and not elsewhere because of no growth of oxide on the nitride-5 layer 1802. The oxide-7 layer 2102 filling the hole-1/3 is called as oxide-7 plug which has a smooth surface leveled as high as the top of the pad-oxide layer 204.

Figure 14:
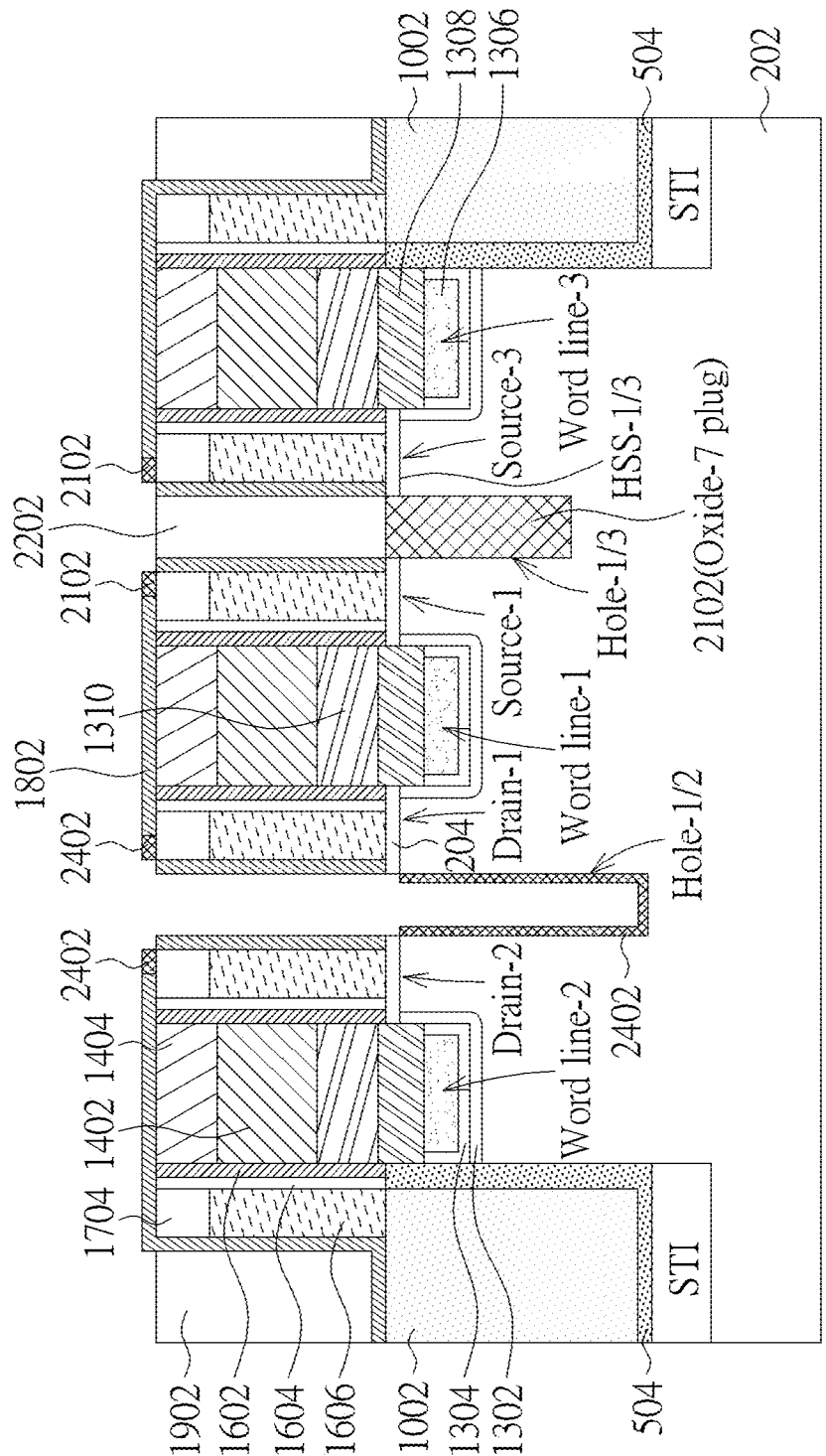

As shown in FIG. 14, deposit the another SOD layer 2202, wherein the another SOD layer 2202 is thick enough to fill into the vacancy on a top of the oxide-7 layer 2102 in the hole-1/3, and top material of the another SOD layer 2202 is removed by the CMP technique until a top of the another SOD layer 2202 is leveled off as high as a top of the nitride-5 layer 1802.

Use the photolithography masking technique to cover the area corresponding to the source region and to expose the area reserved for the drain region, wherein a mask utilized in the photolithography masking technique is not a critical mask and the only function is to allow processing on the HSS-1/2 separately from the processing over the HSS-1/3. Then, the exposed SOD 1902, the exposed nitride-5 layer 1802, and the exposed pad-oxide layer 204 underneath are removed in order to expose the HSS (i.e. the HSS-1/2). Then, the silicon material corresponding to the HSS-1/2 is dug and removed by the anisotropic etching to generate the hole-1/2, wherein the hole-1/2 is physically surrounded by two opposite sides of the p-type substrate 202, respectively, the third side by the lower edge nitride-1 spacer, and the fourth side by the oxide-1 spacer, and both the third side and the fourth side are further bounded outside by the CVD-STI-oxide2.

Figure 15:
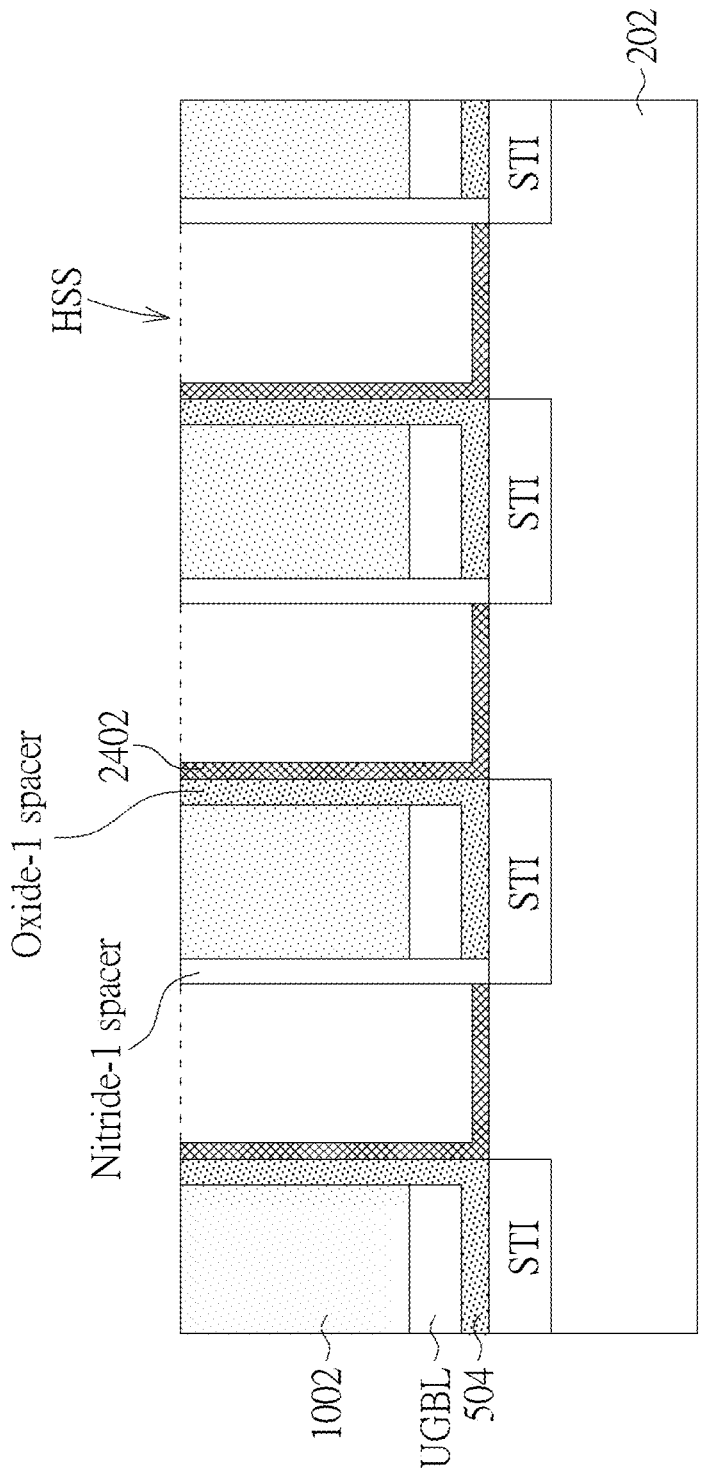
FIG. 15, FIG. 16, FIG. 17, FIG. 18 illustrate forming a storage capacitor over the access transistors.

Then, as shown in FIG. 14, remove the photoresist and the oxide-8 layer 2402 is thermally grown to generate an oxide-8 spacer to cover three inner sidewalls of four sidewalls of the hole-1/2 and a bottom of the hole-1/2 except the third sidewall covered by the lower edge nitride-1 spacer. In addition, the oxide-8 layer 2402 is grown partially on the top of the cap-oxide-1 layer 1704. In addition, FIG. 15 is a diagram illustrating a cross-section view of the DRAM cell array along a Y2 direction which is extended along the center of the hole-1/2 and perpendicular to the X direction, wherein as shown in FIG. 15, the active region is sandwiched by the CVD-STI-oxide2 1002, the bit line (UGBL), the oxide-1 spacer, and the lower edge nitride-1 spacer.

Thereafter, remove lower edge nitride-1 spacer on the third sidewall inside the hole-1/2 by the isotropic etching technique and the nitride-5 layer 1802 is removed at the same time (since the lower edge nitride-1 spacer is so thin so that the isotropic etching technique should not hurt the other structures over the HSS, and should neither remove the oxide-8 layer 2402 inside the hole-1/2).

Figure 16:
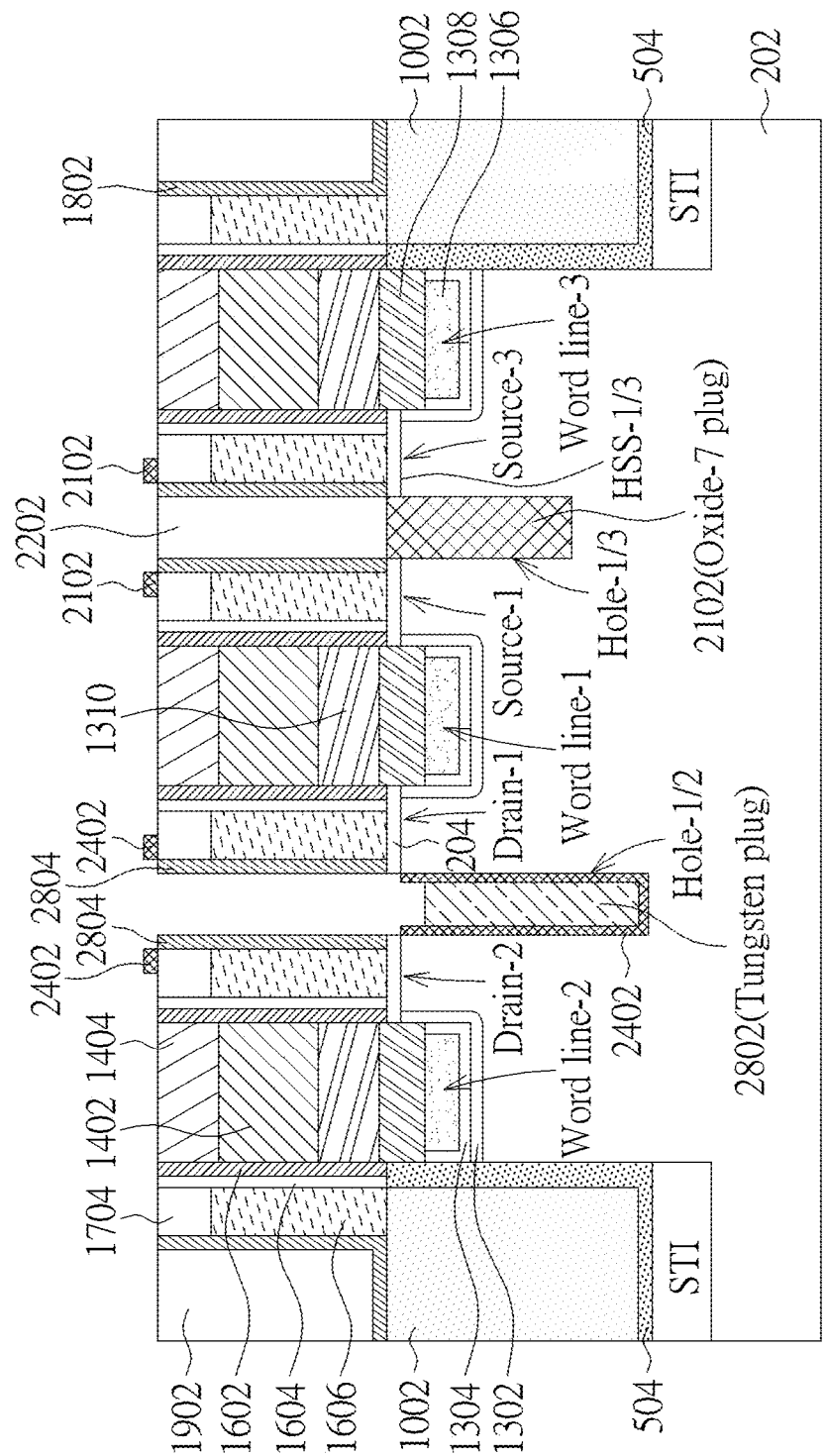

As shown in FIG. 16, deposit the conductive layer (such as, polysilicon, or metal layer, e.g. Tungsten) 2802, wherein the conductive or metal layer 2802 is thick enough to fill in the hole-1/2 and then all the metal layer 2802 over the HSS is etched back by the isotropic etching technique to leave conductive or Tungsten plug inside the hole-1/2, and the conductive or Tungsten plug is connected with the UGBL through its opening at the third sidewall of the hole-1/2 which was originally covered by the lower edge nitride-1 spacer. Then, the nitride-6 layer 2804 is deposited and etched by the anisotropic etching technique to create the nitride-6 spacer surrounding the polysilicon-1 spacer corresponding to the reserved drain regions.

Figure 17:
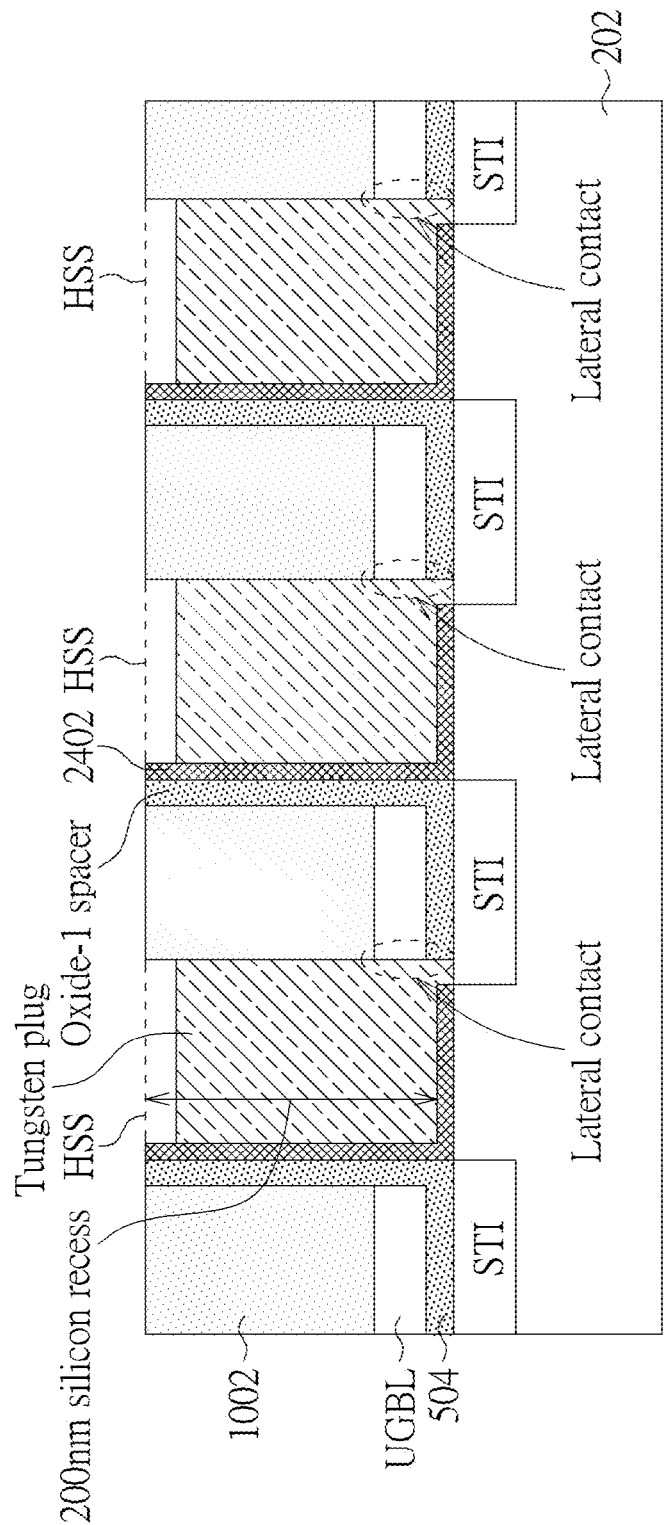

Then, as shown in FIG. 17, etch back some upper portion of the Tungsten plug below the HSS, wherein as shown in FIG. 17, the Tungsten plug is connected to the UGBL from its sidewall of the Tungsten plug to a sidewall of the UGBL inside the hole-1/2.

Figure 18:
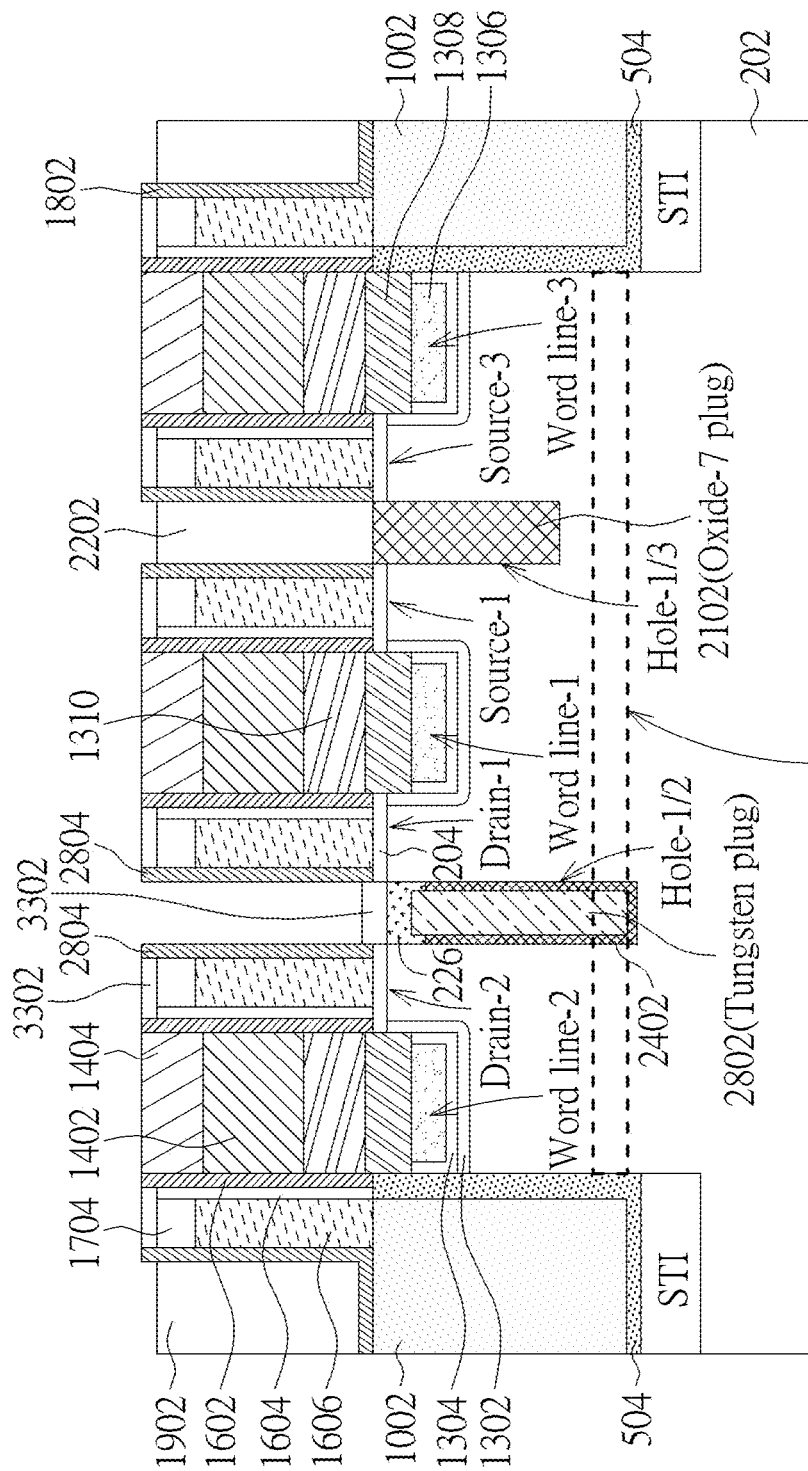

Then, as shown in FIG. 18, utilize the anisotropic etching technique to remove the upper portion of the oxide-8 layer 2402 in the Hole-1/2 by a well-designed amount, resulting in the oxide-8 spacer inside the Hole-1/2 having a lower height than a height of the Tungsten plug accordingly. Some of the cap-oxide-1 layer 1704 may be etched as well.

Then, as shown in FIG. 18, utilize the selective epitaxy growth technique to laterally grow the n+ in-situ doped silicon layer from the two exposed silicon edges (above and adjacent to the oxide-8 layer 2402 and the Tungsten plug), thus resulting in a necklace-type conductive n+ silicon drain (named as n+ silicon drain-collar) 226 connecting to the HSS on two sides of the hole-1/2 as the drain-1 and the drain-2 of the access transistors AQ1, AQ2, respectively, and also as a conductive bridge (i.e. bridge contact) between the UGBL and the access transistors AQ1, AQ2.

Then, as shown in FIG. 18, the oxide-9 layer 3302 with a well-designed thickness is thermally grown locally over the n+silicon drain-collar to cap the HSS-1/2 (and such oxide-9 layer 3302 may cover the cap-oxide-1 layer 1704). In addition, LDD regions and/or other highly doped regions could be formed in the drain region and the source region. Therefore, the word line, UGBL, and the U-shaped transistor are completely formed.

In addition, further processes could be introduced to form the structure similarly shown in FIG. 2A. For example, etch back some of the oxide-9 layer 3302 covering the n+ silicon drain-collar in a thickness with its height as that of the pad-oxide 204, and the oxide-9 layer 3302 covering the cap-oxide-1 layer 1704 is etched away. Then, deposit the thick intrinsic polysilicon-a layer 3402 inside the vacancy above the oxide-9 layer 3302 which is above the hole-1/2 and etch back the polysilicon-a layer 3402. Remove the nitride-6 spacer (the nitride-6 layer 2804) by the isotropic etching technique. Deposit the intrinsic polysilicon-b layer 3502 and then use the anisotropic etching technique to etch back the polysilicon-b layer 3502 to leave some residues to fill into the vacancies right adjacent to the polysilicon-a layer 3402 and form almost the same thickness of both the polysilicon-a layer 3402 and the polysilicon-b layer 3502. Then, all the SODs (i.e. the SOD layer 1902 and the another SOD layer 2202) are removed and the nitride-5 layer 1802 are removed by the isotropic etching technique.

Figure 19:
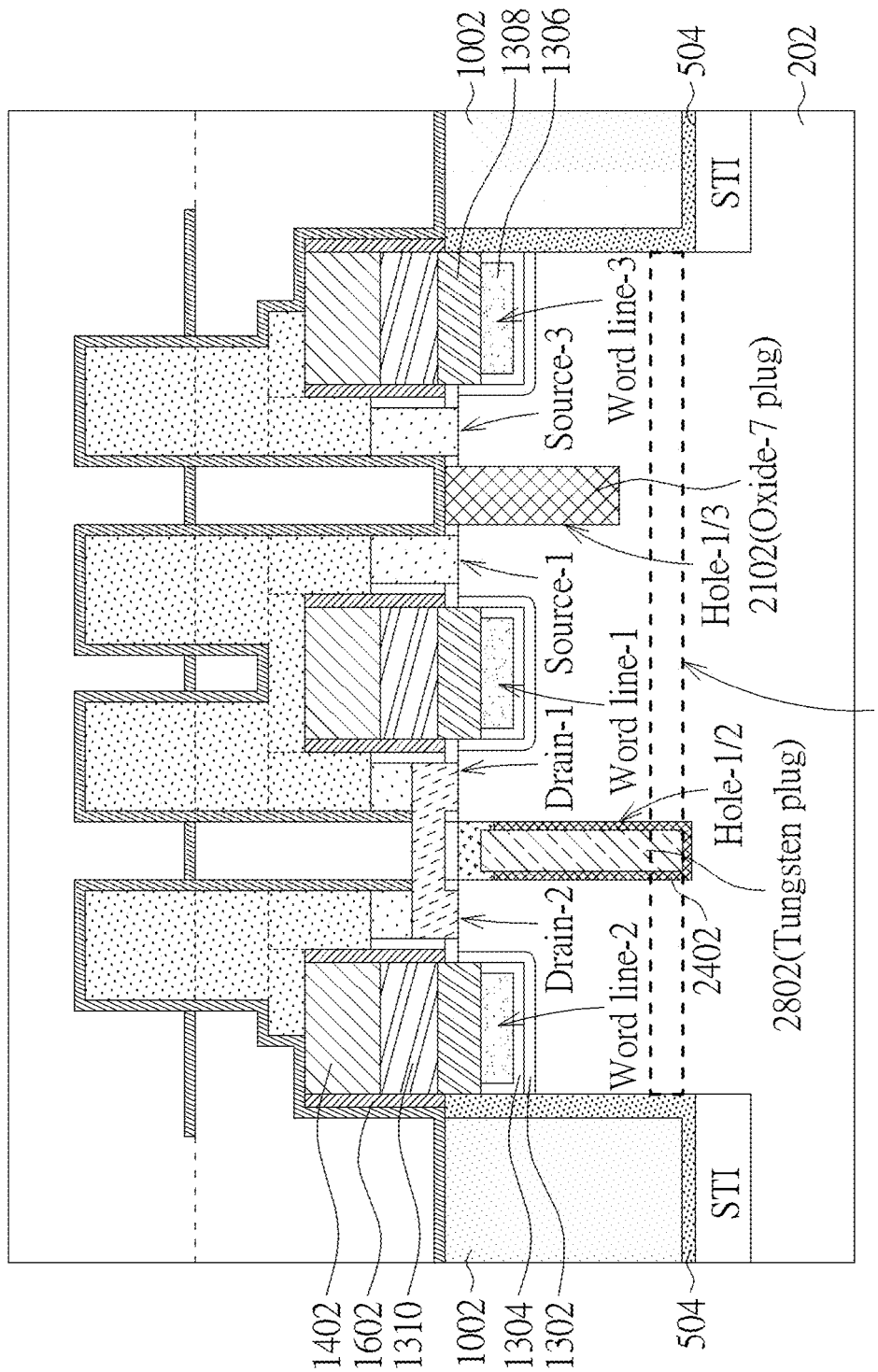
FIG. 19 illustrates a storage capacitor (or storage node SN) being formed to cover the U-shaped transistor.

Step 40: Form a Storage Capacitor Over the Access Transistors:

As shown in FIG. 19, a storage capacitor (or storage node SN) then could be formed to cover the U-shaped transistor, wherein one electrode of the storage capacitor made of silicon/heavily doped silicon is electrically connected to the source region, and the other electrode of the storage capacitor made of Tungsten (or other conductive material) is the counter electrode shared by all storage capacitors. A Hi-K dielectric insulator is formed between two electrodes. The exemplary processes to form the storage capacitor FIG. 19 may refer to the U.S. application patent Ser. No. 17/337,391 filed on Jun. 2, 2021 (Title: MEMORY CELL STRUCTURE), all contents of which is incorporated by reference.

In summary, reducing bit line capacitance of a DRAM cell array design is provided, in which the Cbitline per cell of the present invention could be smaller than ½ of the Cbitline per cell of the conventional DRAM structure, such as ~10×10$^{-3}$ fF (actually only around ¼ of the Cbitline per cell of the conventional DRAM structure) or even lower. Moreover, since the Cbitline per cell could be reduced, according to the above-mentioned equation, there are other choices of the DRAM array design parameters, for example: (1) it is possible to connect more DRAM cells in one bit line such that Cbitline is substantially the same as the conventional value, but ΔV is still maintained within an acceptable range for sensing; or (2) it is possible to reduce the VCC, but ΔV is still maintained within an acceptable range for sensing. For example, as shown in Table 4, if Cbitline per cell is reduced from 0.04 fF to 0.02 fF, 0.01 fF, and 0.007 fF, the number of cells connected to one bit line could be increased from 688 to 1376, 2752, and 3922, respectively, but ΔV is still maintained at ~0.168V.

TABLE 4

| ΔV (v) | Cbitline per cell (fF) | cells per Bit line | Cbitline (fF) | VCC (v) | Cstorage (fF) | Csenseamp + others (fF) |
| --- | --- | --- | --- | --- | --- | --- |
| 0.168 | 0.04 | 688 | 27.5 | 1.1 | 17 | 11 |
| 0.168 | 0.02 | 1376 | 27.5 | 1.1 | 17 | 11 |
| 0.168 | 0.01 | 2752 | 27.5 | 1.1 | 17 | 11 |
| 0.168 | 0.007 | 3922 | 27.5 | 1.1 | 17 | 11 |

As shown in the following Table 5, if ΔV could be reduced to 0.1V, Cstorage is 17 fF, and Cbitline per cell is reduced to 0.02 fF, 0.01 fF, and 0.007 fF, then the number of cells connected to one bit line could be increased to 3280, 6550, and 9371, respectively. However, if ΔV could be reduced to 0.1V, Cstorage is reduced from 17 fF to 8 fF, and Cbitline per cell is reduced to 0.02 fF, 0.01 fF, and 0.007 fF, then the number of cells connected to one bit line could be increased to 1240, 2480, and 3542, respectively.

TABLE 5

| ΔV (v) | Cbitline per cell (fF) | cells per Bit line | Cbitline (fF) | VCC (v) | Cstorage (fF) | Csenseamp + others (fF) |
| --- | --- | --- | --- | --- | --- | --- |
| 0.100 | 0.02 | 3280 | 65.6 | 1.1 | 17 | 11 |
| 0.100 | 0.01 | 6550 | 65.6 | 1.1 | 17 | 11 |
| 0.100 | 0.007 | 9371 | 65.6 | 1.1 | 17 | 11 |
| 0.100 | 0.02 | 1240 | 24.8 | 1.1 | 8 | 11 |
| 0.100 | 0.01 | 2480 | 24.8 | 1.1 | 8 | 11 |
| 0.100 | 0.007 | 3542 | 24.8 | 1.1 | 8 | 11 |

Furthermore, as shown in Table 6, in the event the Cbitline per cell is reduced from 0.04 fF to 0.02 fF, 0.01 fF, and 0.007 fF, the value of VCC could be reduced from 1.1V to 0.8V, 0.65V, and 0.6V, respectively, but ΔV is still maintained within an acceptable range of 0.168V~0.155V.

TABLE 6

| ΔV (v) | Cbitline per cell (fF) | Cbitline (688 cells per bit line fF) | VCC (v) | Cstorage (fF) | Csenseamp + others (fF) |
| --- | --- | --- | --- | --- | --- |
| 0.168 | 0.04 | 27.5 | 1.1 | 17 | 11 |
| 0.163 | 0.02 | 13.8 | 0.8 | 17 | 11 |
| 0.158 | 0.01 | 6.9 | 0.65 | 17 | 11 |
| 0.155 | 0.007 | 4.8 | 0.6 | 17 | 11 |

As shown in the following Table 7, if ΔV could be reduced to 0.1V, Cstorage is 17 fF, there are 688 cells connected to one bit line, and Cbitline per cell is reduced to 0.02 fF, 0.01 fF, and 0.007 fF, then the value of the VCC could be reduced to 0.49V, 0.41V, and 0.385V, respectively. However, if ΔV could be reduced to 0.1V, Cstorage is reduced from 17 fF to 8 fF, there are 688 cells connected to one bit line, and Cbitline per cell is reduced to 0.02 fF, 0.01 fF, and 0.007 fF, then the value of the VCC could be reduced to 0.82V, 0.65V, and 0.6V, respectively.

TABLE 7

| ΔV (v) | Cbitline per cell (fF) | Cbitline (688 cells per bit line fF) | VCC (v) | Cstorage (fF) | Csenseamp + others (fF) |
| --- | --- | --- | --- | --- | --- |
| 0.100 | 0.02 | 13.8 | 0.49 | 17 | 11 |
| 0.100 | 0.01 | 6.9 | 0.41 | 17 | 11 |
| 0.100 | 0.007 | 4.8 | 0.385 | 17 | 11 |
| 0.100 | 0.02 | 13.8 | 0.82 | 8 | 11 |

TABLE 7-continued

| ΔV (v) | Cbitline per cell (fF) | Cbitline (688 cells per bit line fF) | VCC (v) | Cstorage (fF) | Csenseamp + others (fF) |
|---|---|---|---|---|---|
| 0.100 | 0.01 | 6.9 | 0.65 | 8 | 11 |
| 0.100 | 0.007 | 4.8 | 0.6 | 8 | 11 |

To sum up, according to Tables 2~7, it is very obvious that the present invention can dramatically reduce total capacitance related to one bit line, so compared to the prior art, the present invention can make more DRAM cells connected to one bit line.

Although the present invention has been illustrated and described with reference to the embodiments, it is to be understood that the invention is not to be limited to the disclosed embodiments, but on the contrary, is intended to cover various modifications and equivalent arrangements included within the spirit and scope of the appended claims.

What is claimed is:

1. A semiconductor memory structure comprising:
a semiconductor substrate with a top surface, wherein the bit line is disposed under the top surface of the semiconductor substrate and isolated from the semiconductor substrate;
a plurality of DRAM (dynamic random access memory) cells, each DRAM cell comprising an access transistor and a storage capacitor;
a bit line with a first terminal extended along the plurality of DRAM cells to a second terminal, and the bit line coupled to each access transistor of the plurality of DRAM cells; and
a sense amplifier coupled to the first terminal of the bit line;
wherein a capacitance of the bit line per DRAM cell is lower than $20 \times 10^{-3}$ fF.

2. The semiconductor memory structure of claim 1, wherein the capacitance of the bit line per DRAM cell is around $10 \times 10^{-3}$ fF.

3. The semiconductor memory structure of claim 1, wherein the capacitance of the bit line per DRAM cell is less than $10 \times 10^{-3} \sim 20 \times 10^{-3}$ fF.

4. A semiconductor memory structure comprising:
a plurality of DRAM cells, each DRAM cell comprising an access transistor and a storage capacitor;
a bit line with a first terminal extended along the plurality of DRAM cells to a second terminal, and the bit line coupled to each access transistor of the plurality of DRAM cells; and
a sense amplifier coupled to the first terminal of the bit line;
wherein a capacitance of the bit line (Cbitline) between the first terminal and the second terminal is between 4 ~10 fF.

5. A semiconductor memory structure comprising:
a semiconductor substrate with a top surface;
a plurality of DRAM cells, each DRAM cell comprising an access transistor and a storage capacitor;
a bit line with a first terminal extended along the plurality of DRAM cells to a second terminal, and the bit line coupled to each access transistor of the plurality of DRAM cells; and
a sense amplifier coupled to the first terminal of the bit line;
wherein a capacitance of the bit line (Cbitline) between the first terminal and the second terminal is lower than 14 fF;
wherein the bit line is disposed under the top surface of the semiconductor substrate;
wherein a first side surface of the bit line is isolated from the semiconductor substrate by a first isolating material, and a second side surface of the bit line opposite to the first side surface is isolated from the semiconductor substrate by a second isolating material, and the first isolating material is different from the second isolating material.

6. The semiconductor memory structure of claim 5, wherein the first isolating material is SiO2, and the second isolating material is SiOCN.

7. The semiconductor memory structure of claim 5, further comprising:
a word line connected to a gate region of the access transistor of a first DRAM cell in the plurality of DRAM cells;
wherein the word line crosses above the bit line, and a bottom surface of the gate region is under the top surface of the semiconductor substrate.

8. A semiconductor memory structure comprising:
a semiconductor substrate with a top surface;
a plurality of DRAM cells, each DRAM cell comprising an access transistor and a storage capacitor;
a bit line with a first terminal extended along the plurality of DRAM cells to a second terminal, and the bit line coupled to each access transistor of the plurality of DRAM cells; and
a sense amplifier coupled to the first terminal of the bit line;
wherein the plurality of DRAM cells comprise more than 1032 DRAM cells;
wherein the bit line is disposed under the top surface of the semiconductor substrate;
wherein the bit line is vertically and horizontally spaced apart from each access transistor of the plurality of DRAM cells.

9. The semiconductor memory structure of claim 8, wherein the plurality of DRAM cells comprise around 1240~9370 DRAM cells.

10. The semiconductor memory structure of claim 8, wherein the plurality of DRAM cells comprise around 1300~3900 DRAM cells.

11. A semiconductor memory structure comprising:
a semiconductor substrate with a top surface;
a plurality of DRAM cells, each DRAM cell comprising an access transistor and a storage capacitor;
a bit line coupled to each access transistor of the plurality of DRAM cells, wherein the bit line is disposed under the top surface of the semiconductor substrate;
a sense amplifier coupled to a first terminal of the bit line; and
a voltage source electrically connected to the sense amplifier and the bit line;
wherein the voltage source provides not greater than 0.85V to the sense amplifier.

12. The semiconductor memory structure of claim 11, wherein the voltage source provides around 0.4V~0.8V to the sense amplifier.

13. The semiconductor memory structure of claim 11, wherein the voltage source provides around 0.38V~0.6V to the sense amplifier.

14. A semiconductor memory structure which is structurally different from a conventional DRAM structure made by a predetermined technology node, comprising:
- a plurality of DRAM cells, each DRAM cell comprising an access transistor and a storage capacitor;
- a bit line coupled to each access transistor of the plurality of DRAM cells; and
- a sense amplifier coupled to a first terminal of the bit line;
- wherein a capacitance of the bit line per DRAM cell of the semiconductor memory structure is lower than ½ of that of the conventional DRAM structure made by the predetermined technology node, wherein the predetermined technology node is tens nm technology node or below 10 nm technology node.

15. The semiconductor memory structure of claim 14, wherein the capacitance of the bit line per DRAM cell of the semiconductor memory structure is lower than ¼ of that of the conventional DRAM structure made by the predetermined technology node.

* * * * *